United States Patent
Hauf et al.

(10) Patent No.: US 10,761,317 B2
(45) Date of Patent: Sep. 1, 2020

(54) DEVICE FOR SWIVELING A MIRROR ELEMENT WITH TWO DEGREES OF SWIVELING FREEDOM

(71) Applicant: Carl Zeiss SMT GmbH, Oberkochen (DE)

(72) Inventors: Markus Hauf, Ulm (DE); Yanko Sarov, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 15/692,956

(22) Filed: Aug. 31, 2017

(65) Prior Publication Data

US 2017/0363861 A1      Dec. 21, 2017

Related U.S. Application Data

(63) Continuation of application No. PCT/EP2016/055351, filed on Mar. 11, 2016.

(30) Foreign Application Priority Data

Mar. 18, 2015  (DE) ........................ 10 2015 204 874

(51) Int. Cl.
  *G03F 7/20*    (2006.01)
  *G02B 26/08*   (2006.01)
  (Continued)

(52) U.S. Cl.
  CPC ............. *G02B 26/085* (2013.01); *G01C 9/06* (2013.01); *G01D 5/2412* (2013.01);
  (Continued)

(58) Field of Classification Search
  CPC .......... B81B 3/00; G01C 9/06; G01D 5/2412; G02B 19/0023; G02B 19/0095;
  (Continued)

(56) References Cited

U.S. PATENT DOCUMENTS 6,914,711 B2 *  7/2005  Novotny ............ G02B 26/0841
                                                       359/224.1
7,538,471 B2    5/2009  Kurozuka et al.
                        (Continued)

FOREIGN PATENT DOCUMENTS

CN          1690764 A     11/2005
CN        102257421 A     11/2011
                (Continued)

OTHER PUBLICATIONS

German Examination Report, with translation thereof, for corresponding Appl No. 10 2015 204 874.8, dated Feb. 2, 2016.
(Continued)

*Primary Examiner* — Deoram Persaud
(74) *Attorney, Agent, or Firm* — Fish & Richardson P.C.

(57) ABSTRACT

A displacement device for pivoting a mirror element with two degrees of freedom of pivoting includes an electrode structure including actuator electrodes. The actuator electrodes are comb electrodes. All actuator electrodes are arranged in a single plane. The actuator electrodes form a direct drive for pivoting the mirror element.

19 Claims, 9 Drawing Sheets

(51) Int. Cl.
*G02B 19/00* (2006.01)
*G01C 9/06* (2006.01)
*H02N 1/00* (2006.01)
*G01D 5/241* (2006.01)
*G02B 26/10* (2006.01)

(52) U.S. Cl.
CPC ..... *G02B 19/0023* (2013.01); *G02B 19/0095* (2013.01); *G02B 26/0841* (2013.01); *G02B 26/101* (2013.01); *G02B 26/105* (2013.01); *G03F 7/702* (2013.01); *H02N 1/008* (2013.01)

(58) Field of Classification Search
CPC .............. G02B 26/0841; G02B 26/085; G02B 26/101; G02B 26/105; G03F 7/702; G03F 7/70275
See application file for complete search history.

(56) References Cited

U.S. PATENT DOCUMENTS

| | | | |
|---|---|---|---|
| 8,508,098 B2* | 8/2013 | Lubianiker | G02B 26/085 310/309 |
| 2003/0043455 A1 | 3/2003 | Singer et al. | |
| 2004/0081391 A1* | 4/2004 | Ko | H02N 1/008 385/18 |
| 2005/0236928 A1* | 10/2005 | Kurozuka | B81B 3/00 310/309 |
| 2006/0233487 A1* | 10/2006 | Soneda | G02B 6/357 385/18 |
| 2008/0239446 A1* | 10/2008 | Jung | G02B 26/0841 359/225.1 |
| 2009/0296181 A1* | 12/2009 | Omori | G02B 26/0841 359/224.1 |
| 2010/0018635 A1* | 1/2010 | Kouma | G02B 26/0841 156/155 |
| 2010/0142020 A1* | 6/2010 | Kim | G02B 26/0841 359/200.6 |
| 2011/0007376 A1* | 1/2011 | Pinter | B81B 7/0006 359/221.2 |
| 2011/0181852 A1 | 7/2011 | Bleidistel et al. | |
| 2011/0228367 A1* | 9/2011 | Lubianiker | G02B 26/0841 359/199.2 |
| 2012/0044474 A1 | 2/2012 | Hauf et al. | |
| 2012/0307211 A1* | 12/2012 | Hofmann | G02B 26/101 353/31 |
| 2014/0055767 A1* | 2/2014 | Waldis | G02B 7/1815 355/67 |
| 2014/0055797 A1 | 2/2014 | Waldis et al. | |
| 2014/0125950 A1 | 5/2014 | Shimada et al. | |
| 2015/0185469 A1 | 7/2015 | Horn et al. | |
| 2015/0217990 A1* | 8/2015 | Carminati | B81B 3/0043 353/98 |
| 2016/0100139 A1* | 4/2016 | Hofmann | G02B 26/0841 359/199.1 |
| 2016/0332872 A1* | 11/2016 | Iihola | B81C 1/00603 |
| 2018/0180872 A1* | 6/2018 | Hopkins | G02B 26/0841 |
| 2019/0195659 A1* | 6/2019 | Ameling | G03F 7/70825 |

FOREIGN PATENT DOCUMENTS

| | | |
|---|---|---|
| CN | 103547955 A | 1/2014 |
| CN | 103809286 A | 5/2014 |
| DE | 10 2008 049 556 A1 | 4/2010 |
| DE | 10 2012 218 219 A1 | 4/2014 |
| DE | 10 2013 206 529 A1 | 4/2014 |
| DE | 10 2013 206 531 A1 | 5/2014 |
| EP | 1 225 481 A2 | 7/2002 |
| FR | 2 865 201 A1 | 7/2005 |
| WO | WO 2010/049076 A2 | 5/2010 |
| WO | WO 2012/130768 A2 | 10/2012 |

OTHER PUBLICATIONS

International Search Report for corresponding Appl No. PCT/EP2016/055351, dated Aug. 22, 2916.

Holmström et al., "MEMS Laser Scanners: A Review", J. of MicroElectromechanical Systems, IEEE Service Center, US, vol. 23, No. 2. Apr. 1, 2014, p. 270.

Wang et al., "A Novel 2-Dimensional Electric Field Sensor Based on in-Plane Micro Rotary Actuator," IEEE Sensors 2014 Proceedings, Nov. 2, 2014.

Chinese office action, with English translation thereof, for corresponding CN Appl No. 201680016350.4, dated Sep. 4, 2019.

* cited by examiner

DEVICE FOR SWIVELING A MIRROR ELEMENT WITH TWO DEGREES OF SWIVELING FREEDOM

CROSS-REFERENCE TO RELATED APPLICATIONS

The present application is a continuation of, and claims benefit under 35 USC 120 to, international application PCT/EP2016/055351, filed Mar. 11, 2016, which claims benefit under 35 USC 119 of German Application No. DE 10 2015 204 874.8, filed Mar. 18, 2015. The entire disclosure of these applications are incorporated by reference herein.

FIELD

The disclosure relates to a sensor device for capturing the pivot position of a mirror element. Moreover, the disclosure relates to a device for pivoting a mirror element with two degrees of freedom of pivoting. Furthermore, the disclosure relates to an optical component and a mirror array including a plurality of such optical components. Moreover, the disclosure relates to an illumination optical unit and an illumination system for a projection exposure apparatus, and a projection exposure apparatus. In addition, the disclosure relates to a method for producing a microstructured or nanostructured component, and a component that was produced according to this method.

BACKGROUND

By way of example, a mirror array including a multiplicity of displaceable individual mirrors is known from WO 2010/049076 A2. The properties of the actuators which serve to position the individual mirrors, inter alia, play a decisive role for the optical function and quality of such a mirror array. Actuator devices for displacing individual mirrors of a mirror array for a projection exposure apparatus are known from DE 10 2013 206 529 A1 and DE 10 2013 206 531 A1.

FIELD

The disclosure seeks to provide an improved a sensor device for capturing the pivot position of a mirror element.

In one aspect, the disclosure provides a sensor device including a sensor unit which includes a transmitter electrode with a comb structure, a receiver electrode with a comb structure, and a voltage source for applying an AC voltage to the transmitter electrode.

In particular, the sensor device facilitates a direct capture of the pivot position of a mirror element which can be pivoted with the aid of a displacement device in accordance with the preceding description. The sensor device may form a constituent part of such a displacement device. As already mentioned, each of the sensors of the sensor device measures the displacement position of the respective mirror element directly in relation to the reference surface. Firstly, this simplifies the measurement per se; secondly, this facilitates a relatively high precision of the measurement since it is not necessary to take into account running along of the axes, as would be involved in the case of serial kinematics.

The sensor device includes a plurality of differential sensor pairs. In particular, it includes two differential sensor pairs, the measurement axes of which are arranged orthogonal to one another.

Each sensor pair defines a measurement axis, along which the pivot position of the mirror element is captured. By combining the measurement values from all sensor pairs, the tilt position of the mirror element relative to the base plate is captured completely.

Here, a differential sensor pair is understood to mean an arrangement of two sensors which determine a tilt angle from the measurement of two vertical movements. Common mode movements, which are, for example, caused by a vertical movement of the mirror that is caused by thermal expansion, do not contribute to the measurement signal of the measured mirror tilt angle on account of the difference being formed. Consequently, the differential sensor arrangement is advantageous in that the tilt position of the mirror is captured directly and completely by way of the sensor pairs. In particular, to a first approximation, it is not reliant on the stability of the mechanical point of rotation, i.e. of the effective pivot point.

Longitudinal capacitive comb transducers, by which the relative position between a movable armature and a stationary stator can be determined by way of a capacitance measurement, are suited to being differential sensors. The capacitance measurement of such sensors can be effectuated in two different ways: Either the capacitance is measured between the comb fingers of the movable armature and those of the stationary stator. In this case, the measured capacitance depends linearly on the longitudinal overlap of the comb fingers. As an alternative thereto, the capacitance can also be measured between adjacent stator comb fingers, with the fingers of the movable armature combs acting as variable, position-dependent shielding. This alternative is also referred to as shielding mode (shield mode). In this measurement mode, the measured capacitance also depends linearly on the longitudinal overlap of the comb electrodes.

The shield mode has the advantage of being less sensitive in relation to a parasitic motion of the combs relative to one another, for example a transverse movement and/or a tilt.

The first measurement mode facilitates a higher sensitivity.

Both measurement modes are possible. The first one is advantageous on account of its greater sensitivity in the measurement direction, in particular in view of sensor noise. The second one is advantageous in view of linearity and drift stability on account of the lower sensitivity in view of a parasitic motion. The second mode also permits greater manufacturing tolerances.

One of the two measurement modes can be implemented, depending on desired parameters. It is also possible to combine both measurement modes.

In the second alternative, the constituent parts of the sensor device that are mechanically connected to the mirror body form a shielding unit. In particular, the shielding unit has a comb structure. It is arranged relative to the transmitter electrode and receiver electrode of the sensor electrode structure in such a way that a shielding from both is effectuated by immersing the shielding unit between the comb structures of these electrodes. In particular, such shielding is insensitive to a tilt and/or transverse movement of the shielding unit.

The comb structure of the transmitter electrode and/or receiver electrode includes comb fingers that, in particular, are arranged radially in relation to the pivot point of the mirror element.

Preferably, two sensor units are respectively interconnected in a differential manner. They form a sensor pair in each case. Since common errors cancel when a difference is formed, this can suppress the influence of common longitudinal movements along the comb fingers which are caused by parasitic vertical movement such as e.g. thermal drift or vertical vibration modes of the mirror. Moreover, the differential capacitance measurement is advantageous to suppress common disturbing influences and parasitic effects in the supply lines.

In accordance with an aspect of the disclosure, the transmitter electrode and receiver electrode are arranged in a stationary manner in each case, in particular stationary relative to one another. In particular, they may be arranged on the carrying structure. In particular, the sensor device does not include any moving signal lines and/or power lines. An arrangement on the carrying structure facilitates, in particular, the direct capture of the pivot position of the mirror element relative to the carrying structure.

In accordance with a further aspect of the disclosure, the transmitter electrode forms a shielding element, in particular in relation to the actuator electrodes of the displacement device. In particular, it has a circumferentially closed region. In particular, it has an embodiment which completely surrounds the receiver electrode in a plane that is parallel to the comb plane. As a result of this, it is possible to reduce, in particular minimize, in particular prevent, an interaction between the sensor device and the actuator device.

In particular, the sensor device is embodied integrated into the displacement device. In particular, it can form a constituent part of the displacement device. In particular, it is possible to replace some of the actuator electrodes with electrodes from the sensor unit or to use the former as sensor electrodes.

In particular, the sensor unit forms a capacitive sensor.

In particular, the sensor device forms a radial, differential, capacitive comb sensor which is based on the principle of shielding, in particular by immersing the shielding unit between the transmitter and receiver electrodes. An advantage of such a sensor device consists of it being substantially insensitive to thermal expansion of the electrodes and/or of the shielding unit. Moreover, it is substantially insensitive to parasitic mirror motions.

Just like the actuator electrodes form a direct drive of the mirror element, the sensor device is embodied and arranged in such a way that it measures directly between the base plate and mirror element. In particular, the displacement position of the mirror element is measured directly relative to the base plate. A drift, which may, for example, be caused by mechanical transmissions from the mirror element to the sensor electrodes, is reliably avoided. This leads to an increased drift stability, which represents a great advantage, in particular in the case of thermally loaded systems.

The disclosure also seeks to provide an improved device for pivoting a mirror element.

In one aspect, the disclosure provides a device for pivoting a mirror element with two degrees of freedom of pivoting, the device including an electrode structure including actuator electrodes that are embodied as comb electrodes, wherein all active actuator electrodes are arranged in a single plane and wherein the actuators form a direct drive for pivoting the mirror element. Here, the actuator electrodes have an extent in a direction perpendicular to this plane.

Here, a direct drive is understood to mean a drive in which the actuators can directly exert a force onto the mirror to be displaced. In particular, no force transmission mechanism is required. Expressed differently, the drive is force-transmission-mechanism-free.

The displacement of the mirror element can be improved by way of such a design. Below, a displacement should be understood to mean, in general, a displacement in view of a specific degree of freedom. In particular, the displacement can be pivoting, which is also referred to as tilting. In principle, the displacement can also include linear displacements and/or rotations of the mirror element in a mirror plane.

In particular, the actuator characteristic is improved. In particular, the actuator characteristic is linearized over a large movement range. In particular, it is possible to simplify the bearing of the mirror element. Moreover, the actuator device has improved dynamic properties.

According to the disclosure, it was recognized that it is advantageous for precisely setting the tilt angle of the mirror element over a large tilt angle range if the actuators for displacing the mirror element operate over a large tilt angle range and, in the process, exhibit a linear or at least largely linear and deterministic behavior.

Until now, the assumption had been made that comb electrodes are only suitable for pivoting a mirror element about a single pivot axis, i.e. only with one degree of freedom of pivoting. Facilitating pivoting of a mirror element with two degrees of freedom of pivoting involved arranging a plurality of comb electrodes over one another. The actuator device had a stacked design therein, i.e. serial kinematics.

It was recognized that such a design involves a complicated guide mechanism.

Furthermore, it was recognized that a disadvantage of such a design consists of the fact that the wiring from a stationary base plate into a co-moving actuator part needs to be pulled, i.e., there are moving wires or supply lines, and that the sensors do not measure directly from the moving mirror to the base plate but, in general, only an actuated degree of freedom in their respective plane.

According to the disclosure, it was recognized that it is possible to embody an electrode structure with actuator electrodes that are embodied as comb electrodes in such a way that all active actuator electrodes are arranged in a single plane. Here, active electrodes are understood to mean the electrodes to which a variable, in particular controllable, in particular regulable, actuator voltage is applied for displacing the mirror element. Electrodes to which a fixed, i.e. constant voltage is applied are also referred to as passive electrodes. In particular, the passive electrodes can be grounded, or kept at a voltage of 0 V.

The plane in which the active actuator electrodes are arranged is also referred to as actuator plane or comb plane. In particular, it is perpendicular to a surface normal on a central point of the reflection surface of the mirror element to be displaced in a non-pivoted state. In particular, it is parallel to the pivot axes that are defined by the arrangement of the actuator electrodes, about which the mirror element is pivotable, in an unpivoted state. The pivot axes are not necessarily predetermined by the mechanical design of the actuator device. In particular, it is possible to obtain an effective pivot axis that is substantially alignable as desired by combining two pivots and linearly independent pivot axes.

The pivot axes in each case correspond to one of the degrees of freedom of pivoting.

In accordance with an aspect of the disclosure, two pivot axes are predetermined for pivoting the mirror element by way of the mechanical bearing of same. In particular, the mirror element is mounted via a flexure. In particular, it is mounted via a Cardan joint. Two mechanical pivot axes are predetermined by the joint for bearing the mirror element. The two mechanical pivot axes that are predetermined by the joint are aligned, in particular, parallel to the actuator plane.

The two pivot axes intersect at a central point, which is also referred to as pivot point of the mirror element. In particular, the pivot point lies on the surface normal through a central point of the mirror element in the non-pivoted state.

In particular, the mirror element is mounted via a centrally arranged flexure.

The joint has in particular a rotational symmetry, in particular a twofold rotational symmetry.

The mechanical properties of the displacement device, in particular, are improved by bearing the mirror element using a flexure, in particular using a Cardan-type flexure. An advantage of the Cardan-type bearing is that it facilitates a high stiffness in the non-actuated degrees of freedom and a low stiffness of the actuated degrees of freedom, and so the actuators are guided well and a large mode separation arises between actuated and non-actuated degrees of freedom.

Two pivot axes are defined by the joint, the pivot axes having a common point of intersection with a surface normal through the center of the reflection surface of each mirror element. The remaining degrees of freedom are bound with high stiffness.

In particular, the joint can be a Cardan-type flexure that is realized from bending and/or torsion elements. The joint is advantageously soft in the actuated degrees of freedom of tilting and very stiff, in particular at least 10 times, in particular at least 100 times, in particular at least 1000 times stiffer than in the actuated degrees of freedom in all other, bound degrees of freedom.

The joint may include one or more leaf springs. Advantageously, the leaf springs are designed for the best possible thermal conductivity. It was possible to show that, in this case, an embodiment of the joint as a bending joint is advantageous.

The electrode structure includes, in particular, at least two, in particular at least three, in particular at least four comb electrodes. In particular, the electrode structure includes at least two comb electrodes for each degree of freedom. As a result of this, a symmetric movement range about the zero position can be achieved for each degree of freedom.

The comb electrodes respectively include a multiplicity of electrode fingers, which are also referred to as comb fingers. The number of comb fingers per comb electrode lies, in particular, in the range of 3 to 100, in particular in the range of 5 to 50, in particular in the range of 10 to 40, in particular in the range of 20 to 30. Preferably, each of the comb electrodes includes the same number of comb fingers.

Adjacent comb fingers respectively have a spacing in the range of 1 µm to 10 µm, in particular in the range of 3 µm to 7 µm, in particular approximately 5 µm. Here, the spacing denotes the lateral spacing of the comb fingers that are mechanically connected to the mirror body, the comb fingers also being referred to as mirror comb fingers, from the closest comb fingers that are mechanically connected to the base plate, the comb fingers also being referred to as stator comb fingers. The spacing is substantially predetermined by the parasitic transverse movement of the comb fingers. The latter depends, in turn, on the tilt angle range, on the comb overlap, and on the maximum radial dimension of the combs.

The specified spacings relate to a mirror with dimensions of approximately 1 mm-1 mm.

For mirrors with other dimensions and/or an alternative arrangement of the comb fingers, provision is made for scaling the spacings accordingly.

In particular, the actuator device in each case includes two comb electrodes per degree of freedom of pivoting. These two comb electrodes are preferably actuated in a differential manner.

As a result of dedicated actuator pairs for each degree of freedom of pivoting, it is possible to decouple the actuation in view of the two degrees of freedom. This renders it possible to optimize the actuator pair for each of the degrees of freedom and the actuation thereof.

In accordance with an aspect of the disclosure, the actuator device has parallel kinematics. It consequently differs from actuator devices with a serial kinematic concept, in which separate actuator structures are provided for each degree of freedom of pivoting, the separate actuator structures being arranged over one another or in succession. In the case of an actuator device including parallel kinematics, the actuator electrodes for both degrees of freedom of pivoting have an embodiment that is equivalent to one another. In particular, they are arranged equivalently in relation to one another relative to the mirror element to be pivoted and to the base plate.

In contrast to serial kinematics, in which the shafts that are provided for a displacement of an element in a plurality of degrees of freedom are arranged in succession, i.e. in series, and each shaft is driven independently on its own and optionally regulated by way of a sensor and a controller, all actuated degrees of freedom are driven directly by actuators in the parallel kinematics according to the disclosure, the actuators connecting the driven element, i.e. the mirror element, directly to the reference surface, i.e. the base. Consequently, the actuators are arranged in parallel within the meaning of the operative path.

The same applies to the sensors. While only the first axis relates directly to the reference surface in the case of serial kinematics and all further axes run along, each sensor in the parallel kinematics according to the disclosure measures directly from the displaceable mirror element to the reference surface.

All non-driven degrees of freedom of the mirror element are blocked by guides and/or joints.

The actuator electrodes are arranged in such a way that they permit tilting of the mirror element with two degrees of freedom of tilt, without leading to a collision between the combs of the actuator electrodes in this case. The embodiment and the arrangement of the actuator electrodes according to the disclosure renders it possible to obtain a largely linear actuator behavior over a wide actuation range. Until now, tilt mirror drives for two degrees of freedom of tilt, which operate with comb electrodes, were realized either by serial kinematics and/or by transmission mechanisms. It was recognized that, in general, it is very complicated to produce such mechanisms. Moreover, they are connected with many design compromises. These disadvantages are avoided by the embodiment and arrangement of the actuator electrodes according to the disclosure.

The device for pivoting the mirror element according to the disclosure includes, in particular, a comb-electrode-based electrostatic direct drive of the mirror element in two degrees of freedom. Parasitic resonances can be avoided by the direct drive. It is possible to obtain an ideal coupling stiffness from the actuator to the base plate and to the mirror.

The same applies to the sensor device.

An advantage arising herefrom is that the natural frequency spectrum of the mirror element, which is seen by a controller, is determined only by the bearing of the mirror element and not by the mechanical coupling of the actuator and sensor to the mirror element. From the point of view of control theory, this facilitates an expedient actuator sensor collocation, in which the poles of the resonances are separated by zeros and the phase does not rotate further than 180°.

Preferably, all of the actuator electrodes have an identical embodiment apart from their arrangement relative to the mirror element.

In accordance with a further aspect of the disclosure, the electrode structure has a radial symmetry. In particular, it has at least a threefold, in particular at least a fourfold radial symmetry. The radial symmetry of the electrode structure may, in particular, be n-fold, wherein n precisely specifies the number of comb fingers of all active actuator electrodes.

In particular, from a group theory point of view, the symmetry of the arrangement can be described by the D4 group. To the extent that the electrode structure has a circular outer contour, the arrangement of the comb fingers may also be described by a Dn group, with n specifying the number of comb fingers.

In particular, the comb fingers are respectively arranged radially in relation to the effective pivot point of the mirror element or radially in relation to the surface normal of the mirror element in the non-pivoted state. Therefore, the electrode structure is also referred to as a radial comb structure. In principle, the advantages according to the disclosure can also be obtained with an alternative arrangement of the comb fingers, for example a tangential arrangement of the comb fingers.

The individual comb electrodes are respectively arranged in circular-ring-segment-shaped regions. The symmetry properties of the electrodes facilitate a symmetric, in particular axisymmetric mirror geometry and a symmetric, in particular axisymmetric embodiment of the joint. As a result of this, it is possible to obtain the same or at least a similar mode spectrum in the two tilt directions. In particular, it is possible to embody the mirror element in such a way that the moments of inertia and the spring constants are symmetric in relation to the two tilt directions. Then, the eigenmodes may have the same symmetry properties. The symmetry properties of the electrodes consequently facilitate a mechanically particularly advantageous embodiment of the mirror element, in particular in view of the spectrum of the eigenmodes.

In accordance with a further aspect of the disclosure, all active actuator electrodes, in particular all active components of the actuator device, are arranged in a stationary manner on a carrying structure. The carrying structure can be a base plate, in particular.

In addition to the active actuator electrodes, the active components may additionally also include sensor electrodes for capturing the pivot position of the mirror element. In general, such sensor electrodes may form a component of the displacement device.

In accordance with a further aspect of the disclosure, the electrode structure of the displacement device includes sensor electrodes. In particular, the sensor electrodes are arranged in the same plane as the active actuator electrodes. In particular, they are arranged on the carrying structure in a stationary manner.

Preferably, the sensor electrodes have a substantially identical embodiment to the actuator electrodes. Preferably, they are arranged on the carrying structure in a manner that is substantially identical to the actuator electrodes.

In particular, the sensor electrodes are embodied as comb electrodes. In particular, the combs may have a radial arrangement.

The sensor electrodes may, as part of the displacement device, be integrated into the electrode structure with the actuator electrodes.

In accordance with an aspect of the disclosure, provision is made of simultaneously using at least a subset of the actuator electrodes as sensor electrodes. It is also possible to use all of the active actuator electrodes as sensor electrodes. To this end, provision may be made for reading the tilt-angle-dependent actuator capacity at a frequency that is significantly higher, in particular at least a decade higher, than the actuation frequency.

In particular, the sensor electrodes are producible via the same process steps as the actuator electrodes. In particular, it is possible to produce the sensor electrodes and the actuator electrodes in a single method step. The production of the displacement device is simplified as a result.

A stationary arrangement of the active actuator electrodes, in particular of all active components, renders it possible to avoid the actuator device having moving lines, in particular moving signal and/or power lines. As a result, the mechanical properties of the actuator device are further improved. Moreover, the reliability of the actuator device is improved. Finally, this also simplifies the production of the actuator device, in particular of the optical component including such an actuator device.

In accordance with a further aspect of the disclosure, the components of the actuator device are designed for a production method which only uses MEMS method steps. In particular, the individual components of the actuator device, in particular the comb fingers of the actuator electrodes, include only horizontal layers and vertical structures. In particular, the actuators are completely producible via MEMS method steps. This simplifies the production process.

The disclosure further seeks to provide an improved optical component including at least one micromirror with two degrees of freedom of pivoting.

In one aspect, the disclosure provides an optical component including such a micromirror and an actuator device in accordance with the preceding description. The advantages are evident from those of the actuator device.

In accordance with an aspect of the disclosure, the at least one micromirror is mounted via a joint with at least two degrees of freedom of tilting. The joint is, in particular, a flexure, in particular a bending joint. In particular, this can be a Cardan joint. In respect of further details of the joint, reference is made to the preceding description.

In accordance with an aspect of the disclosure, the micromirror has a centroid, the position of which, to all intents and purposes, coincides with that of an effective point of rotation that is defined by the joint.

This improves the mechanical properties of the optical component. In particular, this allows parasitic displacements of the micromirror to be reduced, in particular prevented. Here, the micromirror is understood to mean the totality of the displaceably mounted components of same, in particular the mirror body and the further constituent parts of the optical component that are directly mechanically connected therewith. The further constituent parts may include, in particular, a counterweight, which, to all intents and purposes, is embodied and/or arranged in a suitable manner to adjust the position of the centroid. The centroid is the mechanical centroid of the micromirror. By adjusting the centroid of the displaceable mechanical system in such a way that it coincides with the effective point of rotation of this system, it is possible to improve the stability of the positioning of the micromirror. What is possible to achieve, in particular, is that lateral accelerations, which may be caused e.g. by mechanical vibrations, are not converted into torques that act on the mirror on account of a mass centroid that is offset in relation to the effective point of rotation.

The effective point of rotation defined by the joint is the point of intersection of the two pivot axes that are defined by the joint.

The disclosure seeks to provide an improved mirror array.

In one aspect, the disclosure provides a mirror array with a plurality of optical components in accordance with the preceding description. The advantages are evident from those of the optical components.

Further aspects of the disclosure are to improve an illumination optical unit for a projection exposure apparatus, an illumination system for a projection exposure apparatus, and a projection exposure apparatus.

These features are achieved by an illumination optical unit, an illumination system and a projection exposure apparatus including at least one mirror array in accordance with the preceding description. The advantages are evident from those of the mirror array.

The advantages come to bear, in particular, provided that the radiation source is an EUV radiation source, i.e. a radiation source which emits illumination radiation in the EUV wavelength range between 5 nm and 30 nm.

Further features of the disclosure are to improve a method for producing a microstructured or nanostructured component, and a correspondingly produced component.

These aspects are achieved by the provision of a projection exposure apparatus including at least one mirror array in accordance with the preceding description. The advantages are again evident from those already described.

BRIEF DESCRIPTION OF THE DRAWINGS

Further advantages, details and particulars of the disclosure are evident from the description of exemplary embodiments with reference to the drawings, in which.

DETAILED DESCRIPTION

Firstly, the general construction of a projection exposure apparatus 1 and the constituent parts thereof will be described. For details in this regard, reference should be made to WO 2010/049076 A2, which is hereby fully incorporated in the present application as part thereof. The description of the general structure of the projection exposure apparatus 1 should only be understood to be exemplary. It serves to explain a possible application of the subject matter of the present disclosure. The subject matter of the present disclosure can also be used in other optical systems, in particular in alternative variants of projection exposure apparatuses.

Figure 1:
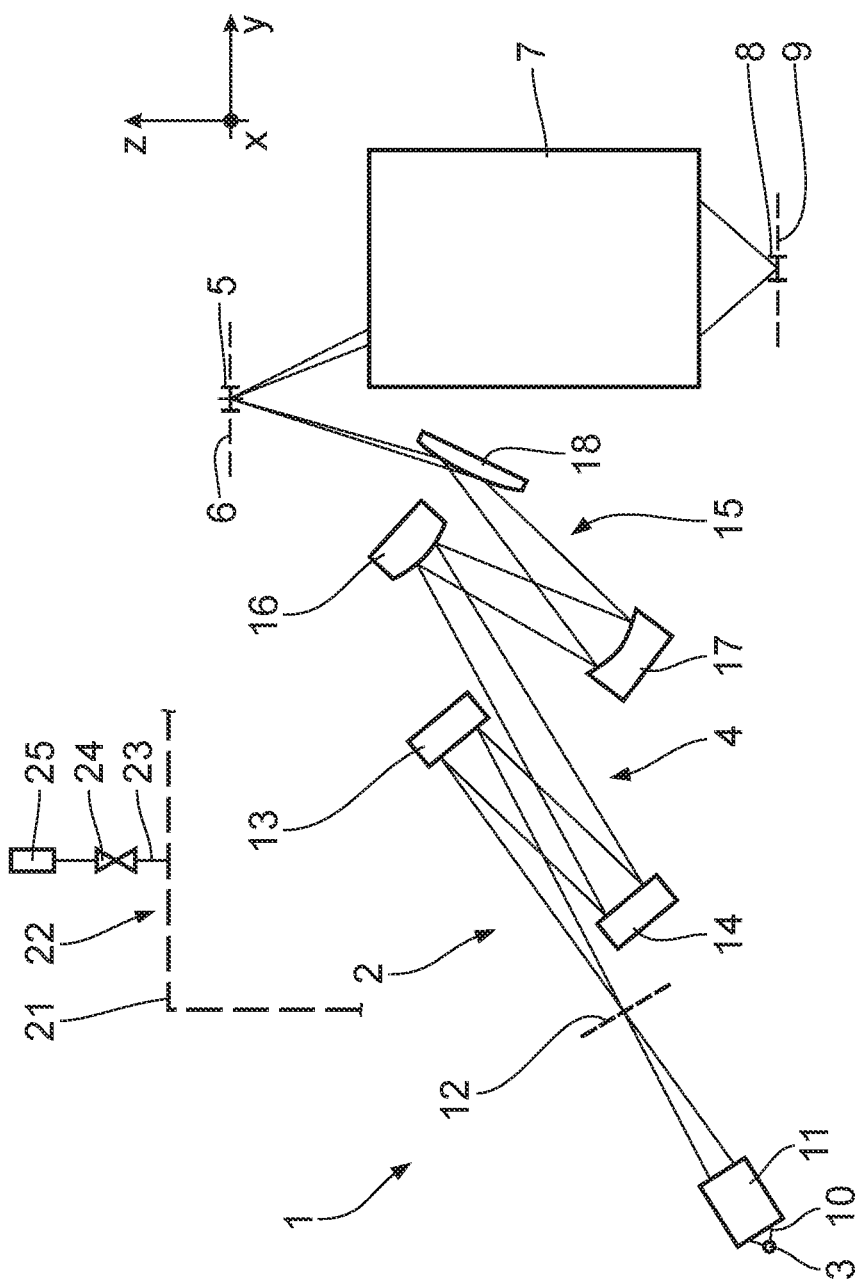
FIG. 1 shows a schematic representation of a projection exposure apparatus and its constituent parts.

FIG. 1 schematically shows a microlithographic projection exposure apparatus 1 in a meridional section. An illumination system 2 of the projection exposure apparatus 1 has, besides a radiation source 3, an illumination optical unit 4 for the exposure of an object field 5 in an object plane 6. The object field 5 can be shaped in a rectangular fashion or in an arcuate fashion with an x/y aspect ratio of 13/1, for example. In this case, a reflective reticle (not illustrated in FIG. 1) arranged in the object field 5 is exposed, the reticle bearing a structure to be projected by the projection exposure apparatus 1 for the production of microstructured or nanostructured semiconductor components. A projection optical unit 7 serves for imaging the object field 5 into an image field 8 in an image plane 9. The structure on the reticle is imaged onto a light-sensitive layer of a wafer, which is not illustrated in the drawing and is arranged in the region of the image field 8 in the image plane 9.

The reticle, which is held by a reticle holder (not illustrated), and the wafer, which is held by a wafer holder (not illustrated), are scanned synchronously in the y-direction during the operation of the projection exposure apparatus 1. Depending on the imaging scale of the projection optical unit 7, it is also possible for the reticle to be scanned in the opposite direction relative to the wafer.

The radiation source 3 is an EUV radiation source having an emitted used radiation in the range of between 5 nm and 30 nm. This can be a plasma source, for example a GDPP (Gas Discharge Produced Plasma) source or an LPP (Laser Produced Plasma) source. Other EUV radiation sources, for example those based on a synchrotron or on a free electron laser (FEL), are also possible.

EUV radiation 10 emerging from the radiation source 3 is focused by a collector 11. A corresponding collector is known for example from EP 1 225 481 A2. Downstream of the collector 11, the EUV radiation 10 propagates through an intermediate focal plane 12 before being incident on a field facet mirror 13. The field facet mirror 13 is arranged in a plane of the illumination optical unit 4 which is optically conjugate with respect to the object plane 6. The field facet mirror 13 may be arranged at a distance from a plane that is conjugate to the object plane 6. In this case, it is referred to, in general, as first facet mirror.

The EUV radiation 10 is also referred to hereinafter as used radiation, illumination radiation or as imaging light.

Downstream of the field facet mirror 13, the EUV radiation 10 is reflected by a pupil facet mirror 14. The pupil facet mirror 14 lies either in the entrance pupil plane of the projection optical unit 7 or in an optically conjugate plane with respect thereto. It may also be arranged at a distance from such a plane.

The field facet mirror 13 and the pupil facet mirror 14 are constructed from a multiplicity of individual mirrors, which will be described in even greater detail below. In this case, the subdivision of the field facet mirror 13 into individual mirrors can be such that each of the field facets which illuminate the entire object field 5 by themselves is represented by exactly one of the individual mirrors. Alternatively, it is possible to construct at least some or all of the field facets using a plurality of such individual mirrors. The same correspondingly applies to the configuration of the pupil facets of the pupil facet mirror 14, which are respectively assigned to the field facets and which can be formed in each case by a single individual mirror or by a plurality of such individual mirrors.

The EUV radiation 10 impinges on both facet mirrors 13, 14 at a defined angle of incidence. In particular, the two facet mirrors are impinged with EUV radiation 10 in the range associated with normal incidence operation, i.e. with an angle of incidence that is less than or equal to 25° in relation to the mirror normal. Impingement with grazing incidence is also possible. The pupil facet mirror 14 is arranged in a plane of the illumination optical unit 4 which constitutes a pupil plane of the projection optical unit 7 or is optically conjugate with respect to a pupil plane of the projection optical unit 7. With the aid of the pupil facet mirror 14 and an imaging optical assembly in the form of a transfer optical unit 15 having mirrors 16, 17 and 18 designated in the order of the beam path for the EUV radiation 10, the field facets of the field facet mirror 13 are imaged into the object field 5 in a manner being superimposed on one another. The last mirror 18 of the transfer optical unit 15 is a mirror for grazing incidence ("grazing incidence mirror"). The transfer optical unit 15 together with the pupil facet mirror 14 is also referred to as a sequential optical unit for transferring the EUV radiation 10 from the field facet mirror 13 toward the object field 5. The illumination light 10 is guided from the radiation source 3 toward the object field 5 via a plurality of illumination channels. Each of these illumination channels is assigned a field facet of the field facet mirror 13 and a pupil facet of the pupil facet mirror 14, the pupil facet being disposed downstream of the field facet. The individual mirrors of the field facet mirror 13 and of the pupil facet mirror 14 can be tiltable by an actuator system, such that a change in the assignment of the pupil facets to the field facets and correspondingly a changed configuration of the illumination channels can be achieved. This results in different illumination settings, which differ in the distribution of the illumination angles of the illumination light 10 over the object field 5.

In order to facilitate the explanation of positional relationships, use is made below of, inter alia, a global Cartesian xyz-coordinate system. The x-axis runs perpendicular to the plane of the drawing toward the observer in FIG. 1. The y-axis runs toward the right in FIG. 1. The z-axis runs upward in FIG. 1.

Different illumination systems can be achieved via a tilting of the individual mirrors of the field facet mirror 13 and a corresponding change in the assignment of the individual mirrors of the field facet mirror 13 to the individual mirrors of the pupil facet mirror 14. Depending on the tilting of the individual mirrors of the field facet mirror 13, the individual mirrors of the pupil facet mirror 14 that are newly assigned to the individual mirrors are tracked by tilting such that an imaging of the field facets of the field facet mirror 13 into the object field 5 is once again ensured.

Further aspects of the illumination optical unit 4 are described below.

The one field facet mirror 13 in the form of a multi- or micro-mirror array (MMA) forms an example of an optical assembly for guiding the used radiation 10, that is to say the EUV radiation beam. The field facet mirror 13 is formed as a microelectromechanical system (MEMS). It has a multiplicity of individual mirrors 20 arranged in a matrix-like manner in rows and columns in a mirror array 19. The mirror arrays 19 are embodied in a modular manner. They can be arranged on a carrying structure that is embodied as a base plate. Here, it is possible to arrange essentially any number of the mirror arrays 19 next to one another. Consequently, the overall reflection surface which is formed by the totality of all mirror arrays 19, in particular the individual mirrors 20 thereof, is extendable as desired. In particular, the mirror arrays are embodied in such a way that they facilitate a substantially gap-free tessellation of a plane. The ratio of the sum of the reflection surfaces 26 of the individual mirrors 20 to the overall area that is covered by mirror arrays 19 is also referred to as integration density. In particular, this integration density is at least 0.5, in particular at least 0.6, in particular at least 0.7, in particular at least 0.8, in particular at least 0.9.

The mirror arrays 19 are fixed onto the base plate via fixing elements 29. For details, reference is made to e.g. WO 2012/130768 A2.

The individual mirrors 20 are designed to be tiltable by an actuator system, as will be explained below. Overall, the field facet mirror 13 has approximately 100 000 of the individual mirrors 20. The field facet mirror 13 may also have a different number of individual mirrors 20 depending on the size of the individual mirrors 20. The number of individual mirrors 20 of the field facet mirror 13 is in particular at least 1000, in particular at least 5000, in particular at least 10 000. It can be up to 100 000, in particular up to 300 000, in particular up to 500 000, in particular up to 1 000 000.

A spectral filter can be arranged upstream of the field facet mirror 13 and separates the used radiation 10 from other wavelength components of the emission of the radiation source 3 that are not usable for the projection exposure. The spectral filter is not represented.

The field facet mirror 13 is impinged on by used radiation 10 having a power of e.g. 840 W and a power density of 6.5 kW/m$^2$.

The entire individual mirror array of the facet mirror 13 has e.g. a diameter of 500 mm and is designed in a closely packed manner with the individual mirrors 20. In so far as a field facet is realized by exactly one individual mirror in each case, the individual mirrors 20 represent the shape of the object field 5, apart from the scaling factor. The facet mirror 13 can be formed from 500 individual mirrors 20 each representing a field facet and having a dimension of approximately 5 mm in the y-direction and 100 mm in the x-direction. As an alternative to the realization of each field facet by exactly one individual mirror 20, each of the field facets can be approximated by groups of smaller individual mirrors 20. A field facet having dimensions of 5 mm in the y-direction and of 100 mm in the x-direction can be constructed e.g. via a 1×20 array of individual mirrors 20 having dimensions of 5 mm×5 mm through to a 10×200 array of individual mirrors 20 having dimensions of 0.5 mm×0.5 mm.

The tilt angles of the individual mirrors 20 are adjusted for changing the illumination settings. In particular, the tilt angles have a displacement range of ±50 mrad, in particular ±100 mrad. An accuracy of better than 0.2 mrad, in particular better than 0.1 mrad, is achieved when setting the tilt position of the individual mirrors 20.

The individual mirrors 20 of the field facet mirror 13 and of the pupil facet mirror 14 in the embodiment of the illumination optical unit 4 according to FIG. 1 bear multilayer coatings for optimizing their reflectivity at the wavelength of the used radiation 10. The temperature of the multilayer coatings should not exceed 425 K during the operation of the projection exposure apparatus 1. This is achieved by a suitable structure of the individual mirrors 20. For details, reference is made to DE 10 2013 206 529 A1, which is hereby fully incorporated into the present application.

Figure 2:
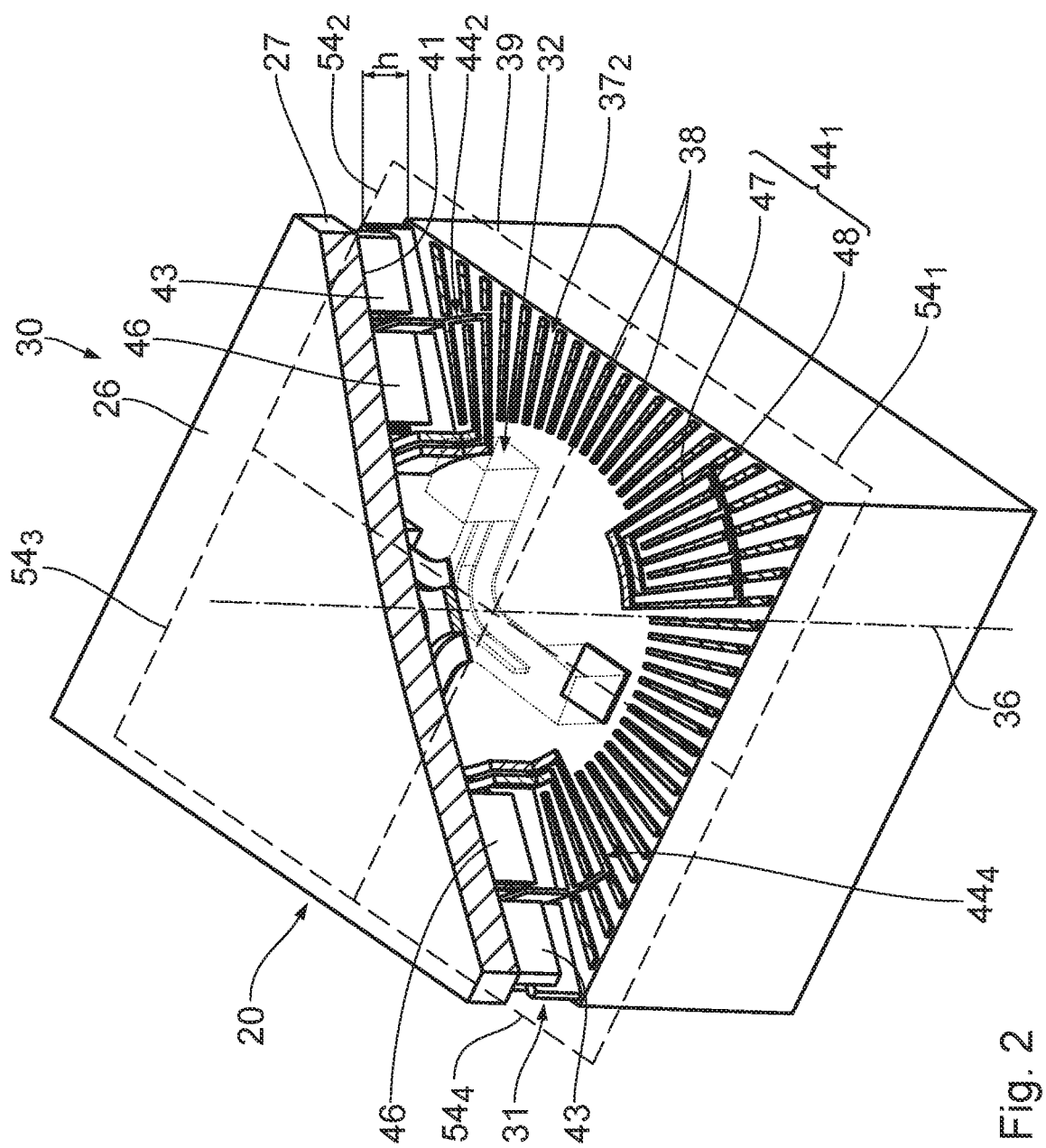
FIG. 2 shows a schematic representation of an optical component with an actuator device and a sensor device.
Figure 6:
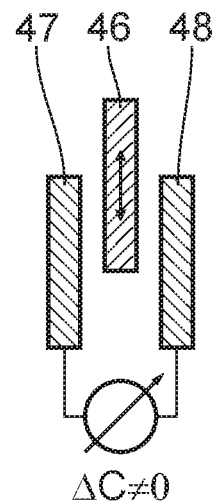
FIGS. 6 to 8 show schematic representations of a section of the sensor device for explaining the sensitivity (FIG. 6) and insensitivity (FIGS. 7 and 8) of same.

The individual mirrors 20 of the illumination optical unit 4 are accommodated in an evacuable chamber 21, a boundary wall 22 of which is indicated in FIGS. 2 and 6. The chamber 21 communicates with a vacuum pump 25 via a fluid line 23, in which a shutoff valve 24 is accommodated. The operating pressure in the evacuable chamber 21 is a few pascals, in particular 3 Pa to 5 Pa (partial pressure $H_2$). All other partial pressures are significantly below $1 \times 10^{-7}$ mbar.

Together with the evacuable chamber 21, the mirror having the plurality of individual mirrors 20 forms an optical assembly for guiding a bundle of the EUV radiation 10.

Each of the individual mirrors 20 can have a reflection surface 26 having dimensions of 0.1 mm×0.1 mm, 0.5 mm×0.5 mm, 0.6 mm×0.6 mm, or else of up to 5 mm×5 mm or larger. The reflection surface 26 can also have smaller dimensions. In particular, it has side lengths in the μm range or low mm range. The individual mirrors 20 are therefore also referred to as micromirrors. The reflection surface 26 is part of a mirror body 27 of the individual mirror 20. The mirror body 27 carries the multilayer coating.

With the aid of the projection exposure apparatus 1, at least one part of the reticle is imaged onto a region of a light-sensitive layer on the wafer for the lithographic production of a micro- or nanostructured component, in particular of a semiconductor component, e.g. of a microchip. Depending on the embodiment of the projection exposure apparatus 1 as a scanner or as a stepper, the reticle and the wafer are moved in a temporally synchronized manner in the y-direction continuously in scanner operation or step by step in stepper operation.

Further details and aspects of the mirror array 19, in particular of the optical components which include the individual mirrors 20, are described below.

Initially, a first variant of an optical component 30 including an individual mirror 20 and, in particular, the displacement device 31 for displacing, in particular for pivoting, the individual mirror 20 is described with reference to FIGS. 2 to 5.

Figure 3:
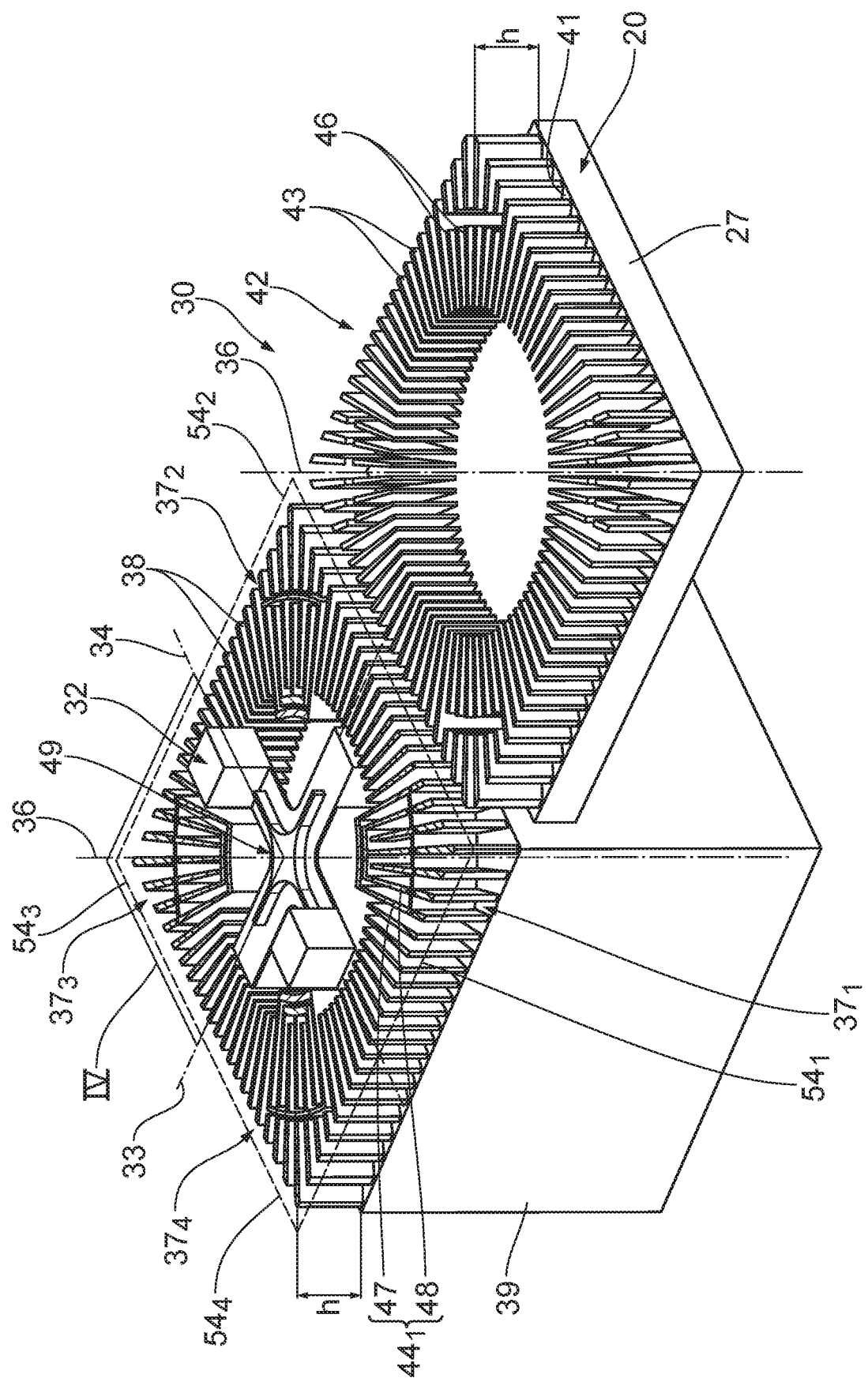
FIG. 3 shows an alternative representation of the optical component in accordance with FIG. 2, in which the mirror body with the counter electrodes or shielding elements arranged thereon is folded to the side.

The representation in accordance with FIG. 3 corresponds to that in accordance with FIG. 2, with the mirror body 27 of the individual mirror 20 being folded away to the side in FIG. 3. As a result, the structures of the displacement device 31 and of the sensor device are better visible.

Figure 4:
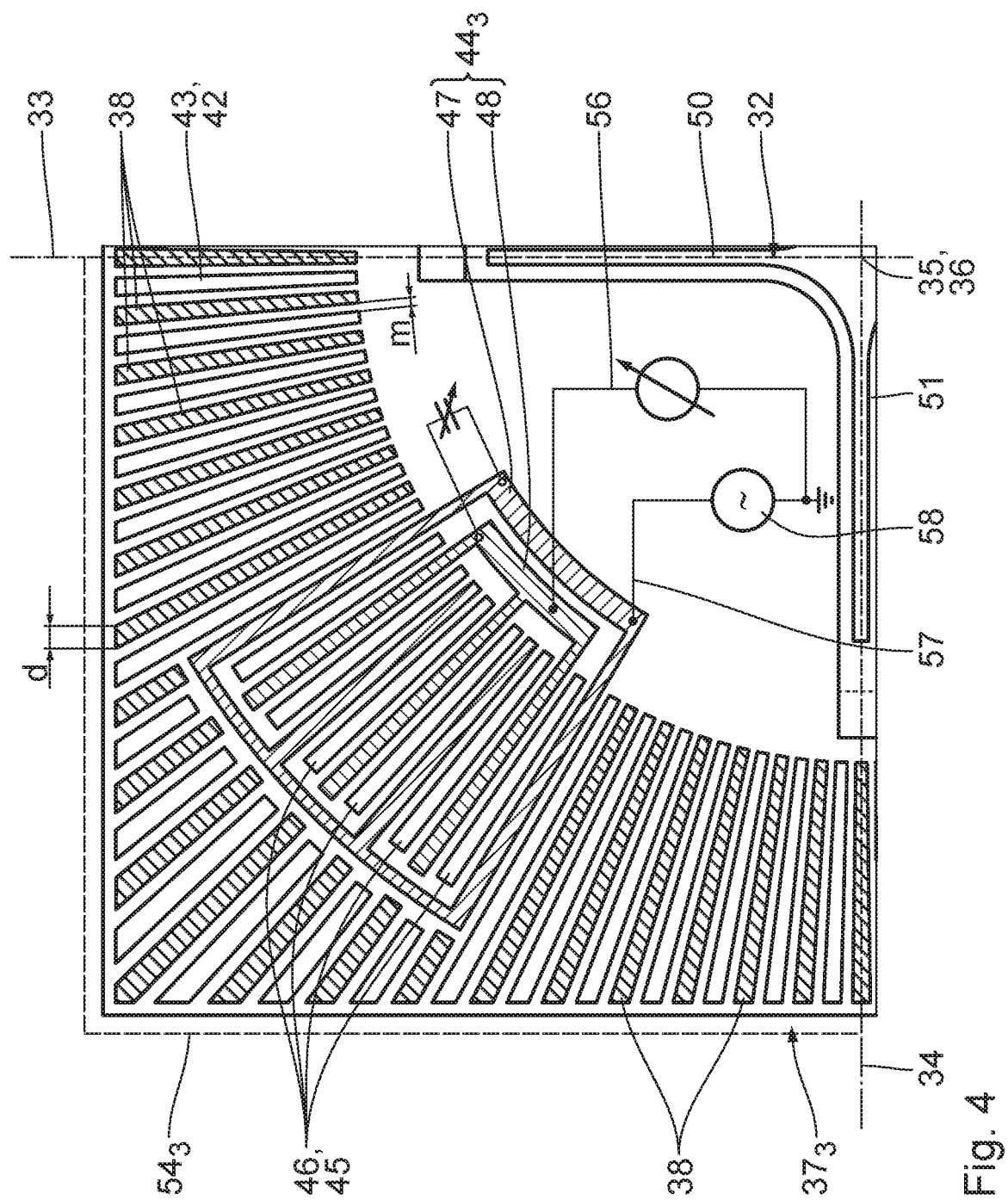
FIG. 4 schematically shows a plan view of the section III in FIG. 3 with a schematic representation of the electrical interconnection of part of the sensor device.
Figure 5:
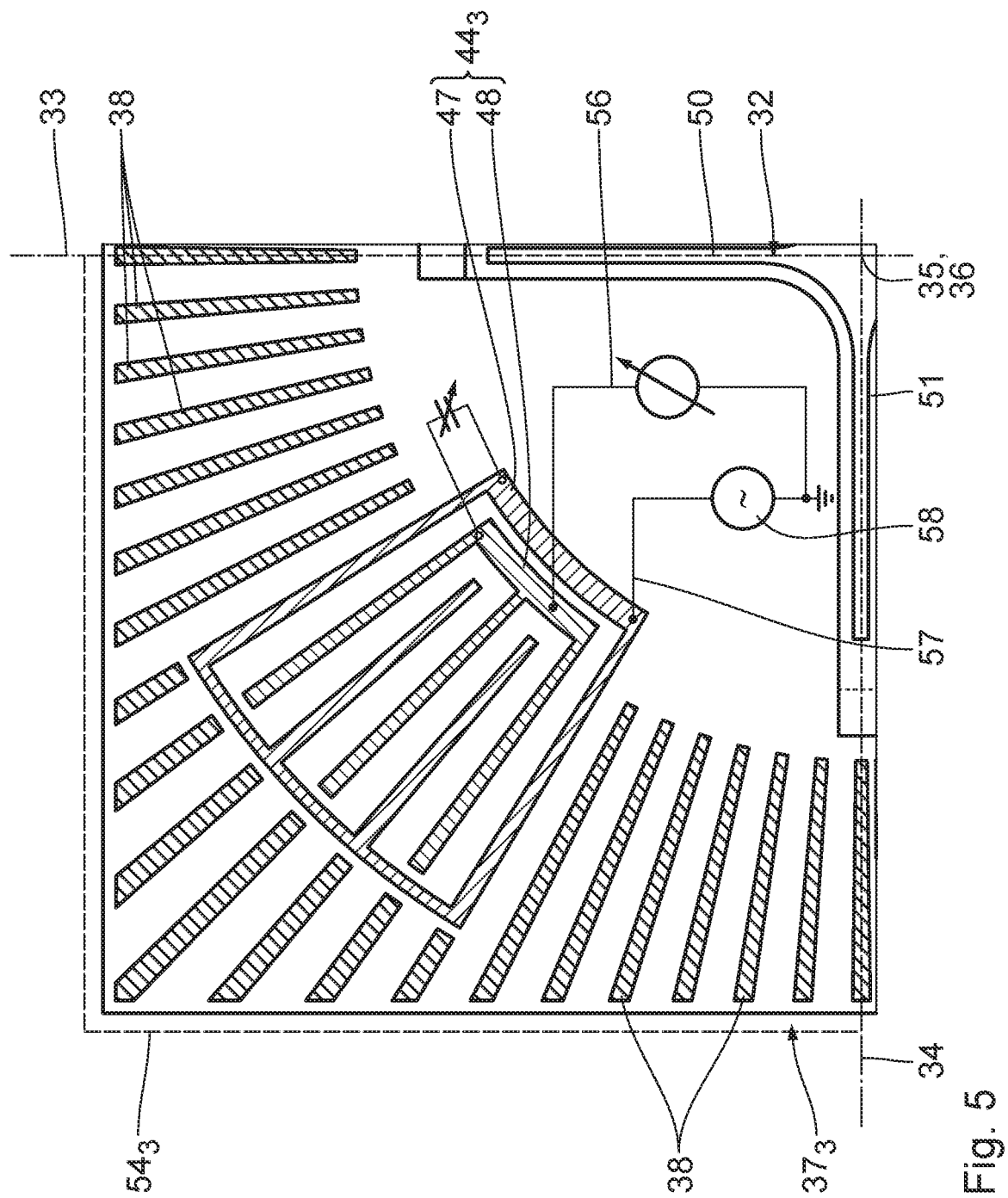
FIG. 5 shows a view in accordance with FIG. 4, in which the comb fingers that are connected to the mirror body are not illustrated.

FIG. 4 shows a sectional representation of a section parallel to the actuator plane 40 of the section IV of the optical component 30 in accordance with FIG. 3.

The optical component includes the individual mirror 20 which, in particular, is embodied as a micromirror. The individual mirror 20 includes the mirror body 27 described above, on the front side of which the reflection surface 26 is formed. In particular, the reflection surface 26 is formed by a multilayer structure. In particular, it has a radiation reflecting property for the illumination radiation 10, in particular for EUV radiation.

In accordance with the variant represented in the figures, the reflection surface 26 has a square embodiment; however, it is represented in a partly cut manner in order also to show the actuator system. It generally has a rectangular embodiment. It can also have a triangular or hexagonal embodiment. In particular, it has such a tile-like embodiment that a gap-free tessellation of a plane by way of the individual mirrors 20 is possible. The individual mirror 20 is mounted via a joint 32 that will still be described in more detail below. In particular, it is mounted in such a way that it has two degrees of freedom of tilting. In particular, the joint 32 facilitates the tilt of the individual mirror 20 about two tilt axes 33, 34. The tilt axes 33, 34 are perpendicular to one another. They intersect at a central point of intersection, which is referred to as effective pivot point 35.

To the extent that the individual mirror 20 is in a non-pivoted neutral position, the effective pivot point 35 lies on a surface normal 36 which extends through a central point, in particular the geometric centroid of the reflection surface 26.

To the extent that nothing else is specified, the direction of the surface normal 36 in the following text is always understood to mean the direction of same in the non-tilted neutral position of the individual mirror 20.

Firstly, the displacement device 31 is described in greater detail below.

The displacement device 31 includes an electrode structure including actuator transducer stator electrodes $37_i$ and actuator transducer mirror electrodes 42. In accordance with the variant illustrated in FIGS. 2 to 5, the electrode structure includes four actuator transducer stator electrodes $37_1$, $37_2$, $37_3$, and $37_4$. In general, the number of actuator transducer stator electrodes $37_i$ is at least 2. It may be 3, 4 or more.

All actuator transducer electrodes $37_i$, 42 are embodied as comb electrodes including a plurality of comb fingers 38. The respectively complementary comb fingers of the mirror and stator engage in one another in this case. The combs of the individual actuator electrodes $37_i$ in each case include 30 actuator transducer stator comb fingers 38, which are also abbreviated as stator comb fingers or merely as comb fingers below. A respectively different number is likewise possible. The number of the comb fingers 38 of the actuator transducer stator electrodes $37_i$ is, in particular, at least 2, in particular at least 3, in particular at least 5, in particular at least 10. It can be up to 50, in particular up to 100.

The combs of the actuator transducer mirror electrodes 42 accordingly include actuator transducer mirror comb fingers 43, which are also abbreviated as mirror comb fingers or merely as comb fingers below. The number of the mirror comb fingers 43 corresponds to the number of the stator comb fingers. It may also deviate by one from the number of stator comb fingers in each case.

The comb fingers 38 are arranged in such a way that they extend in the radial direction in relation to the surface normal 36 or the effective pivot point 35. In accordance with a variant that is not illustrated in the figures, the comb fingers 38, 43 may also be arranged tangentially to circles around the effective pivot point 35. They may also have an embodiment which corresponds to sections of concentric circular cylinder lateral surfaces around the surface normal 36.

All of the actuator transducer stator electrodes $37_i$ are arranged on a carrying structure in the form of a substrate 39. In particular, they are arranged on the substrate 39 in a stationary manner. In particular, they are arranged in a single plane that is defined by the front side of the substrate 39. This plane is also referred to as actuator plane 40 or as comb plane.

In particular, a wafer serves as a substrate 39. The substrate 39 is also referred to as base plate.

The actuator transducer stator electrodes $37_i$ are respectively arranged in a region on the substrate 39 which, firstly, has a square outer contour and, secondly, a circular inner contour. As an alternative thereto, the actuator transducer stator electrodes $37_i$ may also be arranged in a circular-ring-shaped region on the substrate 39. Here, the outer contour also has a circular embodiment. In particular, the individual actuator transducer stator electrodes $37_i$ are respectively arranged in circular-ring-segment-shaped regions. The electrode structure overall, i.e. all actuator transducer stator electrodes $37i$, is arranged in a region which has an outer contour that, to all intents and purposes, corresponds to that of the reflection surface of the individual mirror 20. It may also be arranged in a slightly smaller region, in particular a region that is smaller by approximately 5% to 25%.

The electrode structure has radial symmetry. In particular, it has a fourfold radial symmetry. The electrode structure may also have a different radial symmetry. In particular, it may have a threefold radial symmetry. In particular, it has a k-fold radial symmetry, where k specifies the number of actuator transducer stator electrodes $37_i$. Apart from the subdivision of the electrode structure into the different actuator transducer stator electrodes $37_i$, the electrode structure has an n-fold radial symmetry, where n precisely corresponds to the overall number of comb fingers 38 of all actuator transducer stator electrodes $37_i$.

Apart from their different arrangement on the substrate 39, the individual actuator transducer stator electrodes $37_i$ have an identical embodiment. This is not absolutely necessary. They can also have a different embodiment. In particular, they may be embodied depending on the mechanical properties of the joint 32.

The comb fingers 38 are arranged radially in relation to the effective pivot point 35, or radially in relation to the alignment of the surface normal 36 in the non-pivoted neutral state of the individual mirror 20.

In the case of individual mirrors 20, the mirror bodies 27 of which have dimensions of 1 mm·1 mm, the comb fingers 38 have a thickness d of at most 5 µm at their outer end in the radial direction. In general, the maximum thickness d of the comb fingers 38 at their outer end in the radial direction lies in the range of 1 µm to 20 µm, in particular in the range of 3 µm to 10 µm.

The comb fingers 38 have a height h, i.e. an extent in the direction of the surface normal 36, which is in the range of 10 µm to 100 µm, in particular in the range of 20 µm to 50 µm. Other values are likewise conceivable. The height h is constant in the radial direction. It may also decrease in the radial direction. This can facilitate larger tilt angles, without this leading to the comb fingers of the actuator mirror electrode 42 impacting on the base plate.

Adjacent comb fingers 38, 43 of the actuator electrodes $37_i$ on the one hand and of the actuator mirror electrodes 42 on the other hand have a minimum spacing in the range of 1 µm to 10 µm, in particular in the range of 3 µm to 7 µm, in particular approximately 5 µm, in the non-pivoted state of the individual mirror 20. These values can be scaled appropriately for individual mirrors 20 with smaller or larger dimensions.

This minimum spacing m is the minimum distance between adjacent mirror comb fingers and stator comb fingers, measured in the neutral, non-pivoted state of the individual mirror 20. The comb fingers may approach one another when the individual mirror 20 is tilted. The minimum spacing m is selected in such a way that there is no collision between adjacent mirror comb fingers and stator comb fingers, even in the case of the maximum tilt of the individual mirror 20. Here, manufacturing tolerances have also been taken into account. Such manufacturing tolerances are a few micrometers, in particular at most 3 µm, in particular at most 2 µm, in particular at most 1 µm.

The maximum possible approach of adjacent comb fingers 38, 43 can easily be determined from the geometric details of the same and the arrangement thereof, and the maximum possible tilt of the individual mirror 20. In the present embodiment, the maximum approach of adjacent comb fingers 38, 43 is approximately 2 µm in the case of a tilt of the individual mirror 20 by 100 mrad. In particular, the maximum approach is less than 10 µm, in particular less than 7 µm, in particular less than 5 µm, in particular less than 3 µm.

The actuator transducer stator electrodes $37_i$ respectively interact with an actuator mirror electrode 42. The actuator mirror electrode 42 is connected to the mirror body 27. In particular, the actuator mirror electrode 42 is connected in a mechanically secured manner to the mirror body 27. The actuator transducer mirror electrodes 42 form a counter electrode to the actuator transducer stator electrodes $37_i$. Therefore, they are also simply referred to as counter electrode.

The actuator mirror electrode 42 forms a passive electrode structure. This should be understood to mean that the actuator mirror electrode 42 has a fixed, constant voltage applied thereto.

The actuator mirror electrode 42 has a complementary embodiment to the actuator transducer stator electrodes $37_i$. In particular, it forms a ring with actuator transducer mirror comb fingers 43, which, for simplification purposes, are also referred to as mirror comb fingers or only as comb fingers 43 below. In terms of their geometric properties, the mirror comb fingers 43 of the actuator mirror electrode 42 substantially correspond to the stator comb fingers 38 of the actuator transducer stator electrodes $37_i$.

All comb fingers 38, 43 may have the same height, i.e. identical dimensions in the direction of the surface normal 36. This simplifies the production process.

In the direction of the surface normal 36, the mirror comb fingers 43 of the actuator mirror electrode 42 may also have a different height to that of the stator comb fingers 38 of the active actuator transducer stator electrodes $37_i$.

The comb fingers 38, 43 may have a height h that decreases in the radial direction. It is also possible to embody the comb fingers 38, 43 in the region of the corners of the optical component 30 to be shorter than the remaining comb fingers 38, 43. This can facilitate a greater tilt angle of the individual mirror 20.

In particular, the actuator mirror electrode 42 is embodied in such a way that in each case one of the comb fingers 43 of the actuator mirror electrode 42 is able to be immersed in an interstice between two of the comb fingers 38 of the actuator transducer stator electrodes $37_i$.

The actuator mirror electrode 42 is connected to the mirror body 27 in an electrically conductive manner. Therefore, their comb fingers 43 are equipotential. The mirror body 27 has a low resistance connection to the base plate by way of an electrically conductive joint spring. In principle, it is also possible to individually electrically connect the mirror substrate, i.e. the mirror body 27, the actuator mirror electrodes 42 and the sensor mirror electrodes 45, by way of separate supply lines via the flexure 32 and thus, for example, put these at different potentials or decouple these in respect of faults and/or crosstalk. The base plate may be grounded, but this need not be the case. Alternatively, the mirror can be connected to a voltage source at a different potential by way of a conductive joint spring, but be electrically isolated from the mirror plate. As a result of this, it is possible to apply a fixed or variable bias voltage to the mirror.

An actuator voltage $U_A$ can be applied to the actuator transducer stator electrodes $37_i$ for pivoting the individual mirror 20. Therefore, the actuator transducer stator electrodes $37_i$ are also referred to as active actuator transducer stator electrodes $37_i$. A voltage source that is not depicted in the figures is provided for applying the actuator voltage $U_A$ to the actuator transducer stator electrodes 37i. The actuator voltage $U_A$ is at most 200 volts, in particular at most 100 volts. By suitably applying the actuator voltage $U_A$ to a selection of the actuator transducer stator electrodes $37_i$, the individual mirror 20 can be tilted by up to 50 mrad, in particular up to 100 mrad, in particular up to 150 mrad, from a neutral position. Alternatively, the actuators can also be actuated by a charge source (current source).

Different actuator voltages $U_{Ai}$ can be applied to the various actuator transducer stator electrodes $37_i$ for pivoting the individual mirror 20. A control device that is not illustrated in the figures is provided for controlling the actuator voltages $U_{Ai}$.

For the purposes of tilting one of the individual mirrors 20, an actuator voltage $U_A$ is applied to one of the actuator transducer stator electrodes $37_i$. At the same time, an actuator voltage $U_{A2} \neq U_{A1}$ deviating therefrom is applied to the actuator transducer stator electrode $37_j$ that lies opposite thereto in relation to the surface normal 36. Here, $U_{A2}$ may=0 volts. In particular, it is possible to apply the actuator voltage $U_{A1}$ to only one of the actuator transducer stator electrodes $37_i$, while all other actuator transducer stator electrodes $37_j$ are kept at a voltage of 0 volts.

When the individual mirror 20 is tilted, the comb fingers of the actuator mirror electrode 47 are immersed more deeply between the comb fingers 38 of the actuator transducer stator electrode $37_i$ on one side, in particular in the region of this actuator transducer stator electrode $37_i$ to which the actuator voltage $U_A$ has been applied. On the opposite side of the tilt axis 33, the actuator mirror electrode 42 is immersed less deeply into the actuator transducer stator electrodes $37_j$. The actuator mirror electrode 42 may even emerge from the actuator transducer stator electrodes $37_j$, at least in regions.

The comb overlap, i.e. the immersion depth of the actuator mirror electrode 42 between the actuator transducer stator electrodes $37_i$, is 30 μm in the neutral position of the individual mirror 20 in the case of a mirror dimension of approximately 0.5 mm×0.5 mm.

In the neutral position there is a maximum reduction of the distance between the comb fingers 43 of the actuator mirror electrode 42 and the comb fingers 38 of the actuator transducer stator electrodes $37_i$ of 1.1 μm in the case of a tilt of the mirror 20 by 100 mrad. Consequently, the comb fingers 43 of the actuator mirror electrode 42 and the comb fingers 38 of the actuator transducer stator electrodes $37_i$ are spaced apart from one another, in particular without contact, in every pivot position of the mirror 20. In particular, the immersion depth, i.e. the comb overlap, is selected in such a way that this is ensured.

In accordance with an alternative, the comb fingers 38, 43 are slightly shorter in the outer region and therefore have a relatively small overlap, i.e. a shallower immersion depth. By way of example, the immersion depth in the outermost region may be approximately half as deep as the immersion depth in the inner region. These specifications also relate to the neutral position of the mirror 20.

By way of a dependence of the immersion depth of the comb fingers 38, 43 on the radial position thereof, it is also possible to influence the characteristic, in particular the linearity of the actuation. Since all of the actuator transducer stator electrodes $37_i$ are arranged in a single plane, the actuator plane 40, it is possible to dispense with complicated series kinematics. The displacement device 31 is distinguished by parallel kinematics. In particular, the displacement device 31 has no movably arranged active components. All of the actuator transducer stator electrodes $37_i$, to which the actuator voltage $U_A$ can be applied, are arranged in an immovable stationary manner on the substrate 39. A sensor device is provided for capturing the pivot position of the individual mirror 20. The sensor device may form a constituent part of the displacement device 31.

The sensor device includes sensor transducer mirror electrodes 45 and sensor transducer stator electrodes $44_i$.

The sensor unit includes four sensor transducer stator electrodes $44_1$ to $44_4$. For simplification purposes, the sensor transducer stator electrodes $44_i$ are also referred to only as sensor electrodes. For the actuation, it is advantageous if the number of sensor transducer stator electrodes $44_i$ precisely corresponds to the number of actuator transducer stator electrodes $37_i$. However, the number of sensor transducer stator electrodes $44_i$ can also deviate from the number of actuator transducer stator electrodes $37_i$.

The sensor transducer stator electrodes $44_1$ to $44_4$ are respectively arranged along the diagonal of the substrate 39 in the variant in accordance with FIGS. 2 to 5. In the variant illustrated in FIGS. 2 to 5, the sensor transducer stator electrodes $44_1$ to $44_4$ are arranged with a 45° offset relative to the tilt axes 33, 34 of the joint 32.

The actuator transducer stator electrodes $37_1$ are respectively arranged in quadrants $54_1$ to $54_4$ on the substrate 39. The sensor transducer stator electrodes $44_1$ are respectively arranged in the same quadrant $54_1$ to $54_4$ as respectively one of the actuator transducer stator electrodes $37_i$. The actuator device 31, in particular the arrangement and embodiment of the actuator transducer stator electrodes $37_i$, has substantially the same symmetry properties as the reflection surface 26 of the individual mirror 20. The sensor device, in particular the sensor transducer stator electrodes $44_i$, has substantially the same symmetry properties as the reflection surface 26 of the individual mirror 20.

Respectively two sensor transducer stator electrodes $44_i$ that lie opposite one another in respect of the effective pivot point 35 are interconnected in a differential manner. However, such an interconnection is not mandatory. In general, it is advantageous if respectively two sensor electrodes $44_i$ that lie opposite one another in respect of the effective pivot point 35 are embodied and arranged in such a way that they can be read in a differential manner.

The sensor transducer stator electrodes $44_i$ are embodied as comb electrodes. In particular, the sensor transducer stator electrodes $44_i$ can be embodied in a manner corresponding to the actuator transducer stator electrodes $37_i$, with reference herewith being made to the description thereof. The sensor transducer stator electrodes $44_i$ each include a sensor transducer stator transmitter electrode 47, which is also abbreviated as transmitter electrode below, and a sensor transducer stator receiver electrode 48, which is also abbreviated as receiver electrode below. Both the sensor transducer stator transmitter electrode 47 and the sensor transducer stator receiver electrode 48 have a comb structure. In particular, they include a plurality of comb fingers. In particular, the comb fingers of the sensor transducer stator transmitter electrode 47 are arranged in alternation with the comb fingers of the sensor transducer stator receiver electrode 48.

The sensor device includes a sensor transducer mirror electrode 45 for each of the sensor transducer stator electrodes $44_i$. In accordance with an advantageous embodiment, the sensor transducer mirror electrodes 45 each form a shielding unit of the sensor transducer stator electrodes $44_i$. The sensor transducer mirror electrode 45 in each case includes comb elements with a plurality of comb fingers 46. The sensor transducer mirror electrode 45 is embodied in accordance with a counter electrode fitting to the sensor transducer stator electrodes $44_i$. In particular, the sensor transducer mirror electrodes 45 can be embodied in a manner corresponding to the actuator transducer mirror electrodes 42, with reference herewith being made to the description thereof.

The sensor transducer mirror electrodes 45 are respectively connected in a secured manner to the mirror body 27. They are arranged in the region of the diagonal of the mirror body 27. When the individual mirror 20 is tilted, the sensor transducer mirror electrode 45 can respectively be immersed to a different depth between the comb fingers of the sensor transducer stator electrodes $44_k$, in particular between the transmitter electrode 47 and the receiver electrode 48. As a result of this, there is a variable shielding of adjacent comb fingers, in particular a variable shielding of the receiver electrode 48 from the transmitter electrode 47. This leads to a change in the capacitance between the adjacent comb fingers of the sensor transducer stator electrodes $44_i$ when the individual mirror 20 is pivoted. This change in capacitance can be measured. To this end, the inputs of a measuring appliance are alternately connected with the comb fingers of the sensor transducer stator electrodes $44_k$, as is illustrated schematically in FIG. 4.

The immersion depth of the sensor transducer mirror electrodes 45 between the sensor transducer stator electrodes $44_k$, in particular between the transmitter electrodes 47 and the receiver electrodes 48, is 30 μm. This ensures that the comb fingers 46 still have a residual immersion depth everywhere between the transmitter electrodes 47 and the receiver electrodes 48, even in the maximally tilted pivot position, i.e. they never completely emerge. This ensures the differential sensor operation over the entire tilt range. On the other hand, the immersion depth of the sensor transducer mirror electrode 45 is selected in such a way that there is no collision of same with the substrate 39, even in the maximally tilted pivot position of the individual mirror 20.

An electric voltage, in particular a sensor voltage $U_S$, is applied to the transmitter electrode 47 for the purposes of measuring the capacitance between the transmitter electrode 47 and the receiver electrode 48 of the sensor transducer stator electrodes $44_i$. In particular, an AC voltage serves as a sensor voltage $U_S$.

The sensor device is sensitive in view of the immersion depth of the comb fingers 46 between adjacent comb fingers of the sensor transducer stator electrodes $44_i$ (FIG. 6).

Figure 7:
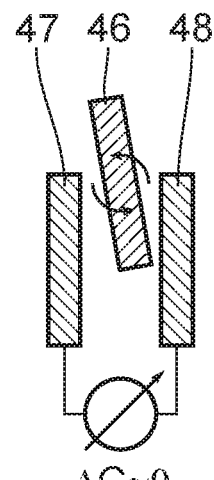

The sensor device is insensitive in relation to pure pivoting of the comb finger 46 relative to the transmitter electrode 47 and the receiver electrode 48 (FIG. 7).

Figure 8:
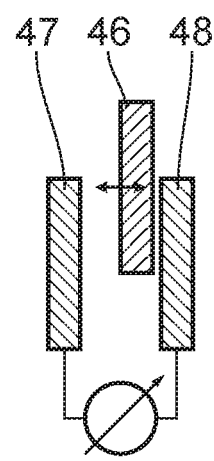

The sensor device is insensitive in relation to a lateral displacement of the shielding element which changes the distance of same from the transmitter electrode 47 and from the receiver electrode 48 but leaves the immersion depth of the comb finger 46 between the adjacent transmitter and receiver electrodes 47, 48 unchanged (FIG. 8).

Further details of the sensor device are described more closely below.

The sensor transducer stator electrodes $44_i$ are arranged within the ring of the actuator transducer stator electrodes $37_i$. In this region, the absolute movements of the comb fingers 46 in the direction parallel to the surface normal 36 are less than outside of the ring of the actuator transducer stator electrodes $37_i$. The absolute scope of movement is related to the distance from the effective pivot point 35.

In the embodiments illustrated in the figures, the sensor transducer stator electrodes $44_i$ protrude inwardly in the radial direction beyond the inner contour of the actuator transducer stator electrodes $37_i$. It is also possible to embody the sensor transducer stator electrodes $44_i$ in such a way that they do not protrude beyond the inner contour of the actuator transducer stator electrodes $37_i$.

The sensor transducer stator electrodes $44_i$ are embodied and arranged radially relative to the effective pivot point 35. In particular, they have comb fingers that extend in the radial direction. This reduces the sensitivity in relation to a possible thermal expansion of the individual mirror 20.

As already explained above, on account of its structure, the sensor device has, at best, a minimal sensitivity in view of parasitic movements of the individual mirror 20, in particular in view of displacements perpendicular to the surface normal 36 and/or rotations about the surface normal 36. On account of the shielding principle of the sensor device, the latter also has, at best, a minimal sensitivity in view of a possible thermal expansion of the individual mirror 20. Moreover, the sensor principle has a minimal sensitivity in view of thermal bending of the mirror.

Respectively two sensor units that lie opposite one another in respect of the effective pivot point 35, each with a transmitter electrode 47 and a receiver electrode 48, are interconnected in a differential manner or at least readable in a differential manner. This renders it possible to eliminate errors in the measurement of the position of the mirror 20, in particular on account of eigenmodes of the individual mirror 20.

The active constituent parts of the sensor device are arranged on the substrate 39. This renders it possible to measure the tilt angle of the individual mirror 20 directly relative to the substrate 39. Moreover, the length of the signal line 56 and/or of the supply lines 57 can be reduced, in particular minimized, on account of the arrangement of the transmitter electrodes 47 and the receiver electrodes 48 on the substrate 39. This reduces possible disturbing influences. This ensures constant operating conditions.

The transmitter electrodes 47 are respectively embodied as active shielding, in particular as a shielding ring, about the receiver electrodes 48. This reduces, in particular minimizes, in particular prevents capacitive crosstalk between the actuator transducer stator electrodes $37_i$ and the sensor device.

As indicated schematically in FIG. 4, an AC voltage is applied to the transmitter electrode 47 from a voltage source 48. The voltage source 58 has a low impedance. In particular, the voltage source 58 has an output impedance which, in the region of the excitation frequency, is less than 1 part in a thousand of the coupling capacitances from the actuator transducer stator electrodes $37_i$ to the transmitter electrodes 47. The output impedance of the voltage source is less than 1 part in a thousand of the capacitances between the transmitter electrodes 47 and the sensor transducer mirror electrodes 45 or the receiver electrodes 48. This ensures that the AC voltage that is applied to the transmitter electrodes 47 is not influenced, or at least not substantially influenced, by the variable actuator voltages $U_A$ or by the variable sensor capacitance.

In general, a network analyzer can be used for reading the sensor transducer. Using this, it is possible to determine the impedance of the sensor transducer and, therefrom, determine the displacement position of the individual mirror 20 via a conversion factor. Such a network analyzer generally includes an excitation source, for example the voltage source 58 described above, and a response measurement, for example a current measurement or a measurement of the charge transported during a signal period. The network impedance and hence the sensor capacitance can be determined from the quotient of excitation voltage and current.

Two variants of the joint 32 are described in greater detail below with reference to FIGS. 9 and 10.

The joint 32 is embodied as a Cardan-type flexure.

Figure 9:
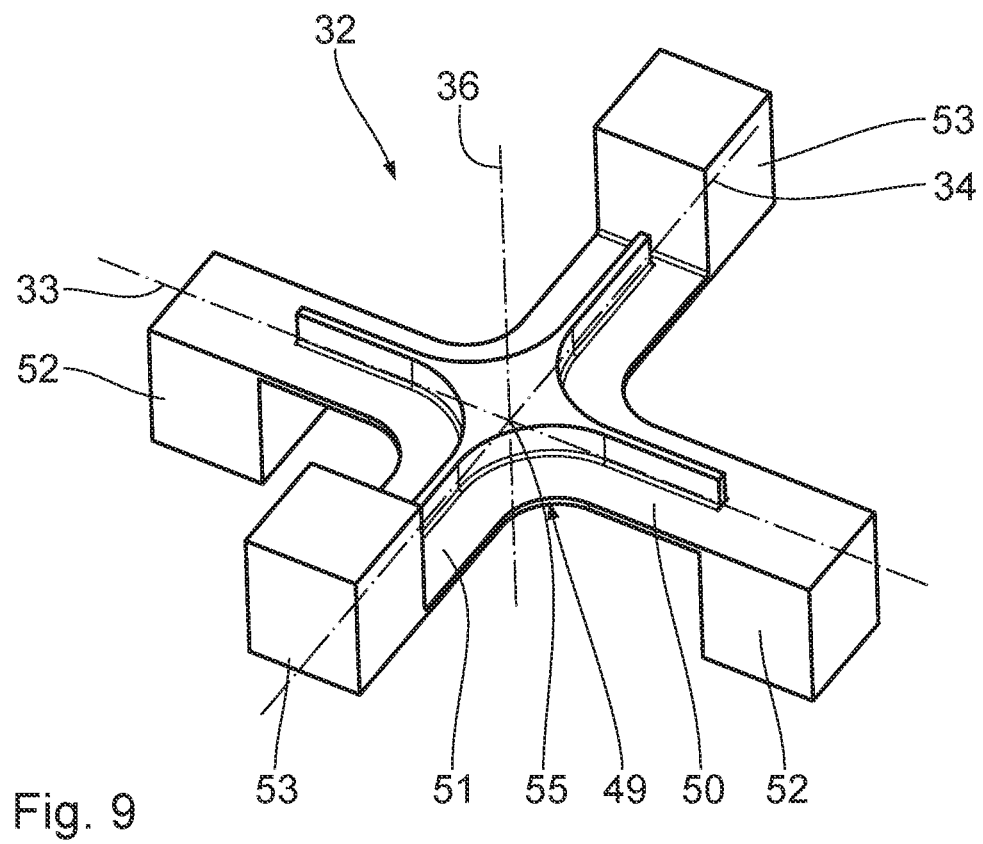
FIG. 9 shows a view of a variant of a joint for bearing an individual mirror, the joint being realized with torsion springs.

In accordance with a variant illustrated in FIG. 9, the joint 32 is embodied as a torsion spring element structure. In particular, it includes two torsion springs 50, 51. The two torsion springs 50, 51 have an integral embodiment. In particular, they are aligned perpendicular to one another and form a cross-shaped structure 49.

The torsion springs 50, 51 have a length of approximately 100 μm, a width of approximately 60 μm, and a thickness of approximately 1 μm to 5 μm. Such torsion springs 50, 51 are suitable as individual mirrors 20 with dimensions of 0.6 mm-0.6 mm. The dimensions of the torsion springs 50, 51 depend on the dimensions of the individual mirrors 20. In general, larger mirrors involve larger, in particular stiffer torsion springs 50, 51.

The torsion spring 50 extends in the direction of the tilt axis 33. The torsion spring 50 is mechanically connected to the substrate 39. Connecting blocks 52 serve to connect the torsion spring 50 to the substrate 39. The connecting blocks 52 in each case have a cuboid embodiment. They can also have a cylindrical, in particular circular-cylindrical embodiment. Other geometric forms are likewise possible.

The connecting blocks 52 are respectively arranged in an end region of the torsion spring 50.

In addition to the connection of the joint 32 to the substrate 39, the connecting blocks 52 also server as spacers between the torsion spring 50 and the substrate 39.

In a manner corresponding to the connection of the torsion spring 50 to the substrate 39, the torsion spring 51 is mechanically connected to the mirror body 27 of the individual mirror 20, which is not illustrated in FIG. 9. Connecting blocks 53 are provided to this end. In terms of their embodiment, the connecting blocks 53 correspond to the connecting blocks 52. The connecting blocks 53 are respectively arranged in an end region of the torsion spring 51.

In the direction of the surface normal 36, the connecting blocks 53 and the connecting blocks 52 are arranged on opposite sides of the cross-shaped structure 49.

The torsion springs 50, 51 of the joint 32 have a T-shaped profile in the region of the limbs of the cross-shaped structure 49 that adjoins the central region. As a result of this, the torsion springs 50, 51 are stiffened, in particular in relation to deflections in the direction of the surface normal 36. What this achieves is that the natural frequency of the mirror 20 in the vertical direction is shifted to high frequencies, and hence a mode separation of the regulated tilt modes and the parasitic vertical vibration mode of more than one decade in frequency space is obtained, which is advantageous from a control theory point of view. Moreover, the thermal conductivity of the joint 32 can be increased by way of the cross-shaped stiffening element 55.

In principle, it is possible to arrange a corresponding stiffening element 55 on the opposite side of the cross-shaped structure 49 as well. In this case, the limbs of the torsion springs 50, 51 have a cross-shaped cross section.

The mechanical and/or thermal properties of the joint can be influenced in a targeted manner by way of a targeted design of the stiffening elements 55. The profile, in particular the stiffening elements 55, serves to increase the stiffness in the actuator plane. In particular, they serve to realize a binding stiffness of the individual mirror 20 in relation to the base plate 39 in the horizontal degrees of freedom, i.e. in a horizontal displacement and a rotation about the vertical axis. As a result of this, the natural frequencies of the parasitic modes of the individual mirror 20 are increased. This obtains a mode spacing of the actuated tilt modes and the parasitic modes that is advantageous from a control theory point of view. In particular, the natural frequencies of the parasitic modes preferably lie at least one decade above the actuated tilt modes.

Moreover, the forces acting between the mirror 20 and the actuator transducer stator comb fingers 38 and the electrostatic softening (negative stiffness) arising as a result thereof are absorbed by the high horizontal stiffness. In particular, it is possible to ensure that there is no transversal pull-in from the view of the comb fingers 38.

The stiffening elements 55, which are also referred to as stiffening ribs, in particular as perpendicular stiffening ribs, serve to shift the deflection stiffness and hence shift the natural frequency of vertical vibrations, i.e. vibrations in the direction of the surface normal 36, to higher frequencies.

The joint 32 is stiff in view of rotations about the surface normal 36. The joint 32 is stiff in view of the linear displacement in the direction of the surface normal 36. In this context, stiff means that the natural frequency of the rotational vibrations about the surface normal 36 and the natural frequency of the vibrations in the direction of the surface normal lie above the actuated modes by more than one frequency decade. The actuated tilt modes of the individual mirror lie, in particular, at frequencies below 1 kHz, in particular below 600 Hz. The natural frequency of the rotational vibrations about the surface normal 36 lies at more than 10 kHz, in particular at more than 30 kHz.

The joint 32 has a known flexibility in view of pivoting about the two tilt axes 33, 34. The stiffness of the joint 32 in view of pivoting about the tilt axes 33, 34 can be influenced by a targeted embodiment of the torsion springs 50, 51.

The joint 32, in particular the connecting blocks 52, 53 and the torsion springs 50, 51, serve to dissipate heat from the mirror body 27. The constituent parts of the joint 32 form thermal conduction sections.

The joint 32 including the connecting blocks 52, 53 has a plurality of functions. Firstly: binding the non-actuated degrees of freedom, secondly, heat transport from the mirror 20 to the base plate 39; and, thirdly, the electrical connection between the mirror 20 and the base plate 39. The purpose of the blocks 52, 53 is primarily to create space for the vertical movement of the joint element. It is self-evident the blocks 52, 53 also forward the mechanical, thermal, and electrical functions of the springs 50, 51.

The torsion springs 50, 51 are made of a material with a coefficient of thermal conduction of at least 50 W/(mK), in particular at least 100 W/(mK), in particular at least 140 W/(mK).

The torsion springs 50, 51 may be made of silicon or a silicon compound. The joint 32 is preferably produced from highly doped monocrystalline silicon. This opens up a process compatibility of the production process with established MEMS manufacturing processes. Moreover, this leads to an advantageously high thermal conductivity and a good electric conductivity.

In the case of an absorbed power density of 10 kW/(m²) and mirror dimensions of 600 μm×600 μm, a temperature difference of 11 K emerges between the mirror body 27 and the substrate 39 with the specified values of the dimensions, in particular with a thickness of the torsion springs 50, 51 of 4 μm, and the thermal conductivity of the torsion springs 50, 51.

The torsion springs 50, 51 may also have a lower thickness. Should the torsion springs 50, 51 have a thickness of 2.4 μm, a temperature difference of 37 K emerges between the mirror body 27 and the substrate 39—in the case of otherwise identical parameter values.

In particular, the thermal conductivity of the torsion spring lies in the range of 0.5 K/kW/m² to 10 K/kW/m², with the thermal power density relating to the mean thermal power absorbed by the mirror. What could be achieved by such torsion springs is that the temperature difference between the mirror body 27 and the substrate 39 is less than 50 K, in particular less than 40 K, in particular less than 30 K, in particular less than 20 K.

Figure 10:
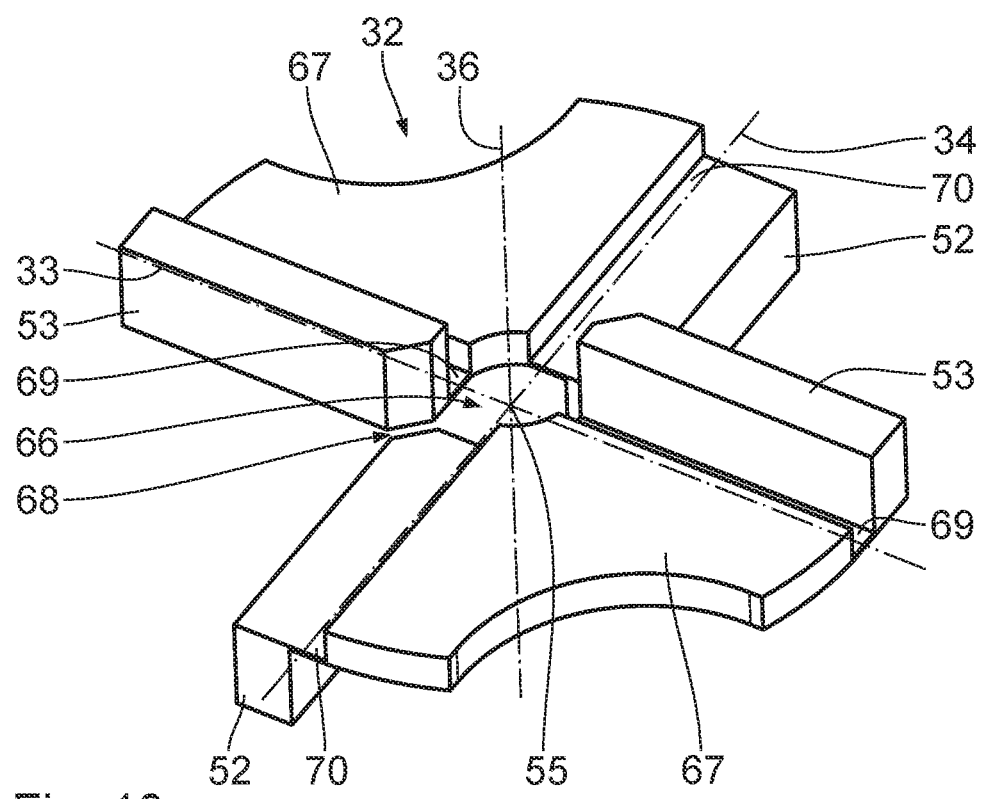
FIG. 10 shows a view of a variant of a joint for bearing an individual mirror, the joint being realized with torsion springs.

In the variant of the joint 32 that is illustrated in FIG. 10, two pairs of bending springs 69, 70 are provided in place of the torsion springs 50, 51. The joint 32 also has a great stiffness in the horizontal degrees of freedom in this alternative. In this respect, reference is made to the description of the alternative illustrated in FIG. 9. The design aspects in view of the horizontal stiffness and in view of the mode separation of the parasitic eigenmodes likewise correspond to what was described above.

The variant of the joint 32 illustrated in FIG. 10 is a Cardan-type flexure with orthogonally arranged, horizontal bending springs 69, 70 that are embodied as leaf springs. Respectively two of the bending springs 69, 70 are connected to one another via a plate-shaped structure 67, which is also referred to as an intermediate plate.

Horizontal leaf springs are advantageous from a process point of view. In particular, they simplify the production of the joint 32.

In the variant in accordance with FIG. 10, the connecting blocks 52, 53 each have an elongate, rod-shaped embodiment. They extend substantially over the entire extent of the joint 32 in the direction of the tilt axes 33, 34.

A separation slot 68 is provided in each case between two of the connecting blocks 52, 53. Hence, the joint 32 has a two-part embodiment.

The joint 32 preferably has axial symmetry in relation to the surface normal 36. Hence, it has a two-fold rotational symmetry. The bending springs 69 and 70, in particular, each have a mirror symmetric embodiment in relation to the surface normal 36.

In the variant in accordance with FIG. 10, the stiffening element 55 is embodied in the form of two plate-shaped structures 67. In particular, the plate-shaped structures 67 are arranged parallel to the plane that is defined by the pivot axes 33, 34. The plate-shaped structures 67 connect the pivot axes 33, 34 that are realized by the bending springs 69, 70. In particular, the pivot axes 33, 34 are aligned orthogonal to one another.

In this alternative, the joint 32 includes a cutout 66 in a central region. The cutout 66 allows the arrangement of further components, for example a counterweight, on the mirror body 27 in the central region of the individual mirror 20, in particular in the region of the surface normal 36, without this leading to a collision with the joint 32. A corresponding cutout 66 can also be provided in the variant in accordance with FIG. 9.

The two plate-shaped structures 67 can also be connected to one another in the central region. As a result of this, an even higher stiffness of the joint 32 can be obtained in the vertical direction, i.e. in the direction of the surface normal 36.

Further aspects, in particular thermal aspects, of the optical component 30 are described below.

The transmitter electrodes 47 and the receiver electrodes 48 have a thermal contact with the substrate 39. The substrate 39 serves as a heatsink. Consequently, both the transmitter electrodes 47 and the receiver electrodes 48 are at the same temperature, or at least substantially at the same temperature, as the substrate 39. The active actuator transducer stator electrodes 37$_i$ also have a thermal contact with the substrate 39. They also preferably have substantially the same temperature as the substrate 39 during the operation of the displacement device 31. Consequently, the temperature of the sensor transducer stator electrodes 44$_i$ is substantially constant during the operation of the optical component 30. In particular, it is independent of the temperature of the individual mirror 20. Potential variations in the temperature of the substrate 39 can be compensated. In particular, they can be compensated substantially more easily than temperature variations of the individual mirror 20.

The optical component 30, which lies in the region of the surface normal 36, has a thermal center 59. A heat flow extends to the outside, substantially in the radial direction.

The sensor transducer stator electrodes 44$_i$ are arranged radially symmetrically relative to the thermal center 59. A thermal expansion of the individual mirror 20 only leads to a radial displacement of the comb fingers 46. By contrast, the sensor device is substantially insensitive.

Below, further aspects, embodiments and arrangements of the actuator transducer stator electrodes 37$_i$ and of the sensor transducer stator electrodes 44$_i$ are described with reference to FIG. 11.

In each case, two actuator transducer stator electrodes 37$_i$ that lie opposite one another in relation to the effective pivot point 35 form an electrode pair 60$_1$, 60$_2$. The electrode pairs 60$_1$, 60$_2$ are actuated in a differential manner. The electrode pairs 60$_i$, 60$_2$ can be actuated in a differential manner over the entire movement range of the individual mirror 20. As an alternative thereto, it is, in principle, also possible to have superposition at the center. They serve to tilt the individual mirror 20 about the actuator axes 61$_1$ 61$_2$; the actuator axes 61$_1$, 61$_2$ extend along the diagonal of the optical component 30, in particular parallel to the diagonals of the mirror body 27 of the individual mirror 20. The actuator axes 61$_1$, 61$_2$ are defined by the actuator transducer electrodes 37$_i$, 42 that are arranged in the quadrants 54$_1$ and 54$_3$, and 54$_2$ and 54$_4$, respectively. The actuator axes 61$_1$, 61$_2$ are respectively arranged twisted by 45° in relation to the tilt axes 33, 34 that are defined by the joint 32.

The sensor transducer stator electrodes 44$_i$ are arranged along the diagonal of the substrate 39. In each case, two sensor transducer stator electrodes 44$_i$ that lie opposite one another in relation to the effective pivot point 35 form an electrode pair $62_1$, $62_2$. The sensor transducer stator electrodes $44_i$ of the electrode pairs $62_1$, $62_2$ are interconnected in a differential manner. They serve to determine the tilt or pivot position relative to the actuator axes $61_1$, $61_2$. Respectively one of the electrode pairs $62_1$, $62_2$ of the sensor device is assigned to one of the electrode pairs $60_1$, $60_2$ of the actuator transducer stator electrodes $37_i$ and accordingly aligned like the latter.

All transducer electrodes $37_i$, $42_i$, $44_i$, 45 are embodied as comb electrodes with a plurality of comb fingers, wherein the respectively complementary comb fingers of mirror and stator engage in one another and therefore form a capacitor, the capacitance of which depends largely linearly on the immersion depth.

All comb fingers of the displacement device 31, in particular all comb fingers of the actuator transducer stator electrodes $37_i$, of the actuator mirror electrode 42, and of the sensor transducer stator electrodes $44_i$ and of the sensor transducer mirror electrode 45 have the same dimensions in the direction of the surface normal 36. Inter alia, this simplifies the production of same. In particular, it is possible to produce the entire electrode structure which is arranged on the substrate 39 and/or the entire electrode structure which is connected to the mirror body 27 using one and the same sequence of process steps.

All active actuator transducer stator electrodes $37_i$ have a thermal contact with the substrate 39. Consequently, their temperature during the operation of the displacement device 31 substantially corresponds to the temperature of the substrate 39. This leads to improved, substantially constant operating conditions.

The mirror body 27 is electrically grounded. An electrically conductive contact to this end is established by the joint 32. Alternatively, a defined bias voltage can be applied to the mirror body 27 by way of the joint 32 in order to set a different operating voltage operating point or region for actuators and sensors.

Figure 11:
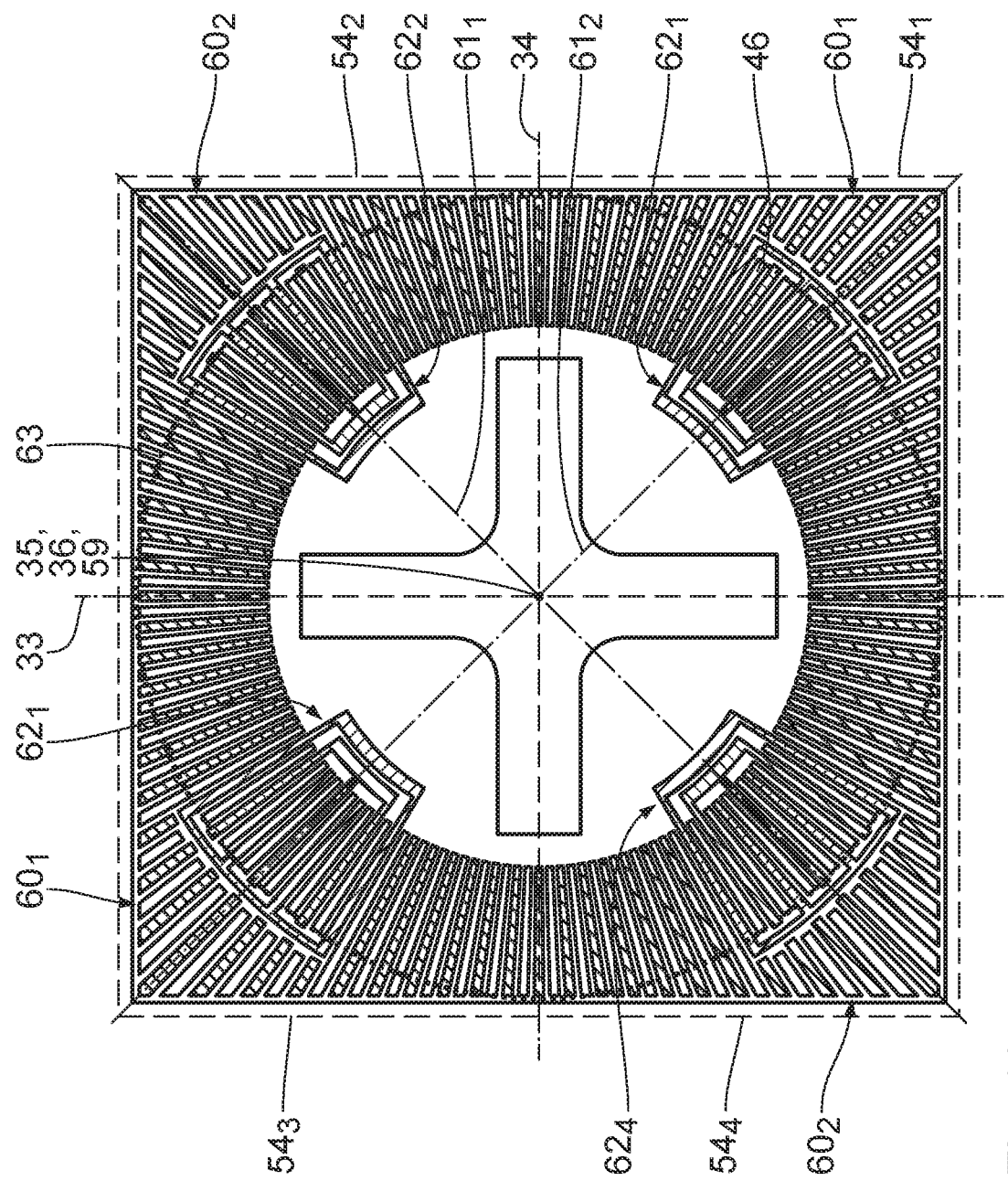
FIG. 11 shows a schematic sectional representation of the optical component in accordance with FIG. 2 for the purposes of elucidating further aspects of the actuator device and sensor device.

An emergence circle 63 has been plotted in FIG. 11 for elucidation purposes. The emergence circle 63 surrounds the region within which there is no emergence of the actuator mirror electrode 42 from the actuator transducer stator electrodes $37_i$ or emergence of the comb fingers 46 from the sensor transducer stator electrodes $44_i$, even in the case of a maximum tilt of the individual mirror 20. The actuator mirror electrode 42 may emerge from the actuator transducer stator electrodes $37_i$ outside of the emergence circle 63.

Preferably, all comb fingers 46 of the sensor device are arranged within the emergence circle 63. Consequently, the comb fingers 46 do not emerge from the sensor transducer stator electrodes $44_i$ in any possible tilt position of the individual mirror 20. In particular, they never emerge completely from the sensor transducer stator electrodes $44_i$. This ensures that the tilt position of the individual mirror 20 can always be ascertained reliably with the aid of the sensor device.

Preferably, the emergence circle 63 has a diameter which substantially corresponds to the side length of the reflection surface 26 of the individual mirror 20. It may also be slightly larger. Provided that the emergence circle 63 has a diameter which, to all intents and purposes, corresponds to the diagonal of the reflection surface 26 of the individual mirror 20, an emergence of the actuator mirror electrode 42 from the actuator transducer stator electrodes $37_i$ is completely avoided. This may be advantageous, but is not mandatory.

The radius of the emergence circle 63 depends on the maximum tilt angle range and on the comb overlap of the comb fingers.

The maximum possible tilt position of the individual mirror 20 can be restricted by mechanical elements, in particular by abutment elements. Such abutment elements may be arranged on the substrate 39. They are preferably arranged at the edge, i.e. outside the electrode structure of the displacement device 31.

A further variant of the optical component 30 is described below with reference to FIG. 12. The optical component 30 in accordance with the variant schematically illustrated in FIG. 12 corresponds to one of the variants described above, to which reference is made herewith.

Figure 12:
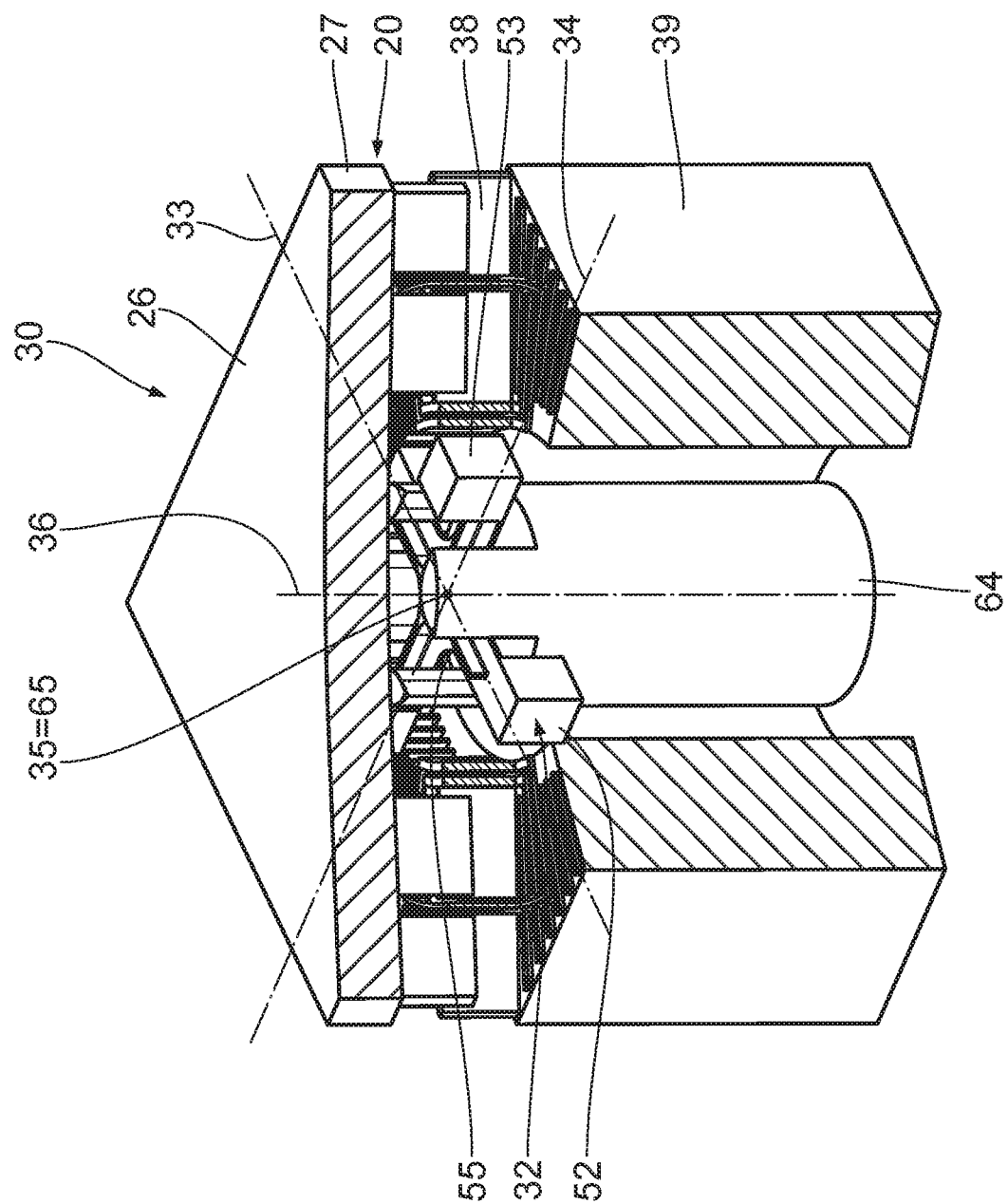
FIG. 12 shows a schematic representation of a further variant of the optical component, including a counterweight in order to place the centroid of the moving mirror into the point of rotation of the joint.

In accordance with the variant that is schematically illustrated in FIG. 12, provision is made for arranging a compensation weight 64 on the side of the mirror body 27 that lies opposite the joint 32 in the direction of the surface normal 36. The compensation weight 64 is securely connected to the mirror body 27. In particular, it has a direct connection to the mirror body 27.

The compensation weight 64 is embodied and arranged in such a way that the mass centroid 65 of the mechanical system, which includes all constituent parts of the optical component 30 that move together with the mirror body 27 of the individual mirror 20, coincides, to all intents and purposes, with the effective pivot point 35. The mass centroid 65 can be displaced in a targeted manner by a targeted embodiment and arrangement of the compensation weight 64. By displacing the mass centroid 65 in such a way that the position thereof coincides with that of the effective pivot point 35, it is possible to substantially reduce the sensitivity of the individual mirror in relation to external disturbances. Moreover, parasitic eigenmodes are kept in a high-frequency range, which is sufficiently far away from the frequency spectrum that occurs during a displacement of the individual mirror 20 via the actuator device.

What can be achieved via the compensation weight 64 is that the mass centroid 65 of the mechanical system, which, as a matter of principle, may have been shifted out of the effective pivot point 35 of the joint 32, is pushed back into the effective pivot point 35.

In the direction of the surface normal 36, the compensation weight 64 may have a length of up to 500 µm.

Preferably, the compensation weight 64 has a rotational symmetry in relation to the surface normal 36. It can have in particular a cylindrical, in particular circular-cylindrical embodiment. Apart from a connecting piece, by which it is mechanically connected to the mirror body 27, it may also have a substantially spherical embodiment.

In particular, the compensation weight 64 has a rotational symmetry that corresponds to the rotational symmetry of the joint 32.

The compensation weight 64 may have circular-sector-shaped recesses. Moreover, it may have a central cavity that extends in the direction of the surface normal 36. This cavity facilitates access to the material under the joint 32. If desired, this material can be removed as sacrificial material.

What arranging the compensation weight 64, in particular by way of displacing the mass centroid 65 of the mechanical system in such a way that it coincides with the effective pivot point 35, achieves is that accelerations in the horizontal direction, which may e.g. be caused by mechanical vibrations, are not translated into tilt moments which have an interfering effect on the set mirror position. As a result of the compensation weight 64, the individual mirror 20 can be made less sensitive in relation to vibration excitations. In particular, the tilt angle stability at a given vibration spectrum is improved. Expressed differently, the arrangement of the compensation weight 64 forms a measure for reducing the mirror sensitivity in relation to disturbances.

In a particularly advantageous variant, the compensation weight 64 can simultaneously form an abutment element, in particular a so-called end stop, by which a maximum possible tilt of the individual mirror 20 is delimited. As a result of this, the individual mirror 20 can be protected from mechanical damage and/or an electrical short circuit. By em-bodying the compensation weight 64 as an abutment element, it can simultaneously be used as a mechanical reference for the mirror tilt. In particular, it is possible to examine and/or recalibrate the sensor device in relation to a possible drift via an end abutment gate. This renders it possible to dispense with an external measurement system. This substantially simplifies monitoring and/or calibrating of the sensor device.

On the other hand, the compensation weight 64 is embodied and arranged in such a way that it is without contact with the substrate 39 and the constituent parts of the displacement device 31 within the possible displacement range of the individual mirror 20. A specific recess in the substrate 39 may be provided for the compensation weight 64. In particular, the recess for the compensation weight 64 is arranged in the interior of the ring-shaped electrode structure.

The different variants of the displacement device 31, of the sensor device, of the joint 32 and of the remaining constituent parts of the optical component 30 can be combined substantially freely with one another.

In accordance with a further variant, the actuators may also be used as sensors at the same time. To this end, provision is made for reading the tilt-angle-dependent actuator capacity at a frequency that is significantly higher, in particular at least one decade higher, than the actuation frequency (control bandwidth). A separate sensor device can be dispensed with in this case. It is also possible to additionally provide a dedicated separate sensor device, in particular in accordance with the preceding description.

The displacement device 31 is preferably producible via a MEMS method. In particular, it has a design which is designed for a manufacture using MEMS method steps. In particular, it predominantly has, in particular exclusively has, horizontal layers which may be structured in the vertical direction.

In particular, the electrodes 37$_i$, 42, 44$_i$, 45 are producible via MEMS method steps. The joint 32 is preferably also producible via MEMS method steps.

What is claimed is:

1. A displacement device, comprising:
an electrode structure comprising actuator electrodes,
wherein:
the actuator electrodes comprise comb electrodes;
all active actuator electrodes are arranged in a single plane;
the actuator electrodes define a direct drive configured to pivot a mirror element having two degrees of freedom of pivoting; and
the electrode structure has a fourfold radial symmetry.
2. The displacement device of claim 1, wherein the mirror element is mounted via a Cardan-type flexure.
3. The displacement device of claim 1, wherein the actuator electrodes are arranged radially in relation to an effective pivot point of the micromirror.
4. The displacement device of claim 1, wherein all active actuator electrodes are arranged in a stationary manner on a carrying structure.
5. The displacement device of claim 1, wherein the electrode structure comprises sensor electrodes arranged in the same plane as the active actuator electrodes.
6. The displacement device of claim 1, wherein at least some the active actuator electrodes are simultaneously sensor electrodes.
7. A mirror array, comprising:
a plurality of optical components,
wherein, for at least some of the plurality of optical components, the optical component comprises:
a micromirror with two degrees of freedom of pivoting; and
at least one member selected from the group consisting of:
a sensor device; and
a displacement device according to claim 1 configured to displace the micromirror.
8. An illumination optical unit, comprising:
a mirror array, comprising a plurality of optical components,
wherein:
the illumination optical unit is configured to guide illumination radiation to an object field; and
for at least some of the plurality of optical components, the optical component comprises:
a micromirror with two degrees of freedom of pivoting; and
at least one member selected from the group consisting of:
a sensor device; and
a displacement device according to claim 1 configured to displace the micromirror.
9. An illumination system, comprising:
a radiation source; and
an illumination optical unit configured to guide illumination radiation to an object field, the illumination optical unit comprising a mirror array which comprises a plurality of optical components,
wherein:
for at least some of the plurality of optical components, the optical component comprises:
a micromirror with two degrees of freedom of pivoting; and
at least one member selected from the group consisting of:
a sensor device; and
a displacement device according to claim 1 configured to displace the micromirror.
10. An apparatus comprising:
an illumination optical unit configured to guide illumination radiation to an object field; and
a projection optical unit configured to project a reticle in the object field into an image field,
wherein:
the apparatus is a microlithographic projection exposure apparatus;
the illumination optical unit comprises a mirror array comprising a plurality of optical components,
for at least some of the plurality of optical components, the optical component comprises:
a micromirror with two degrees of freedom of pivoting; and
at least one member selected from the group consisting of:

a sensor device; and a displacement device according to claim 1 configured to displace the micromirror.

11. A method of using a microlithographic projection exposure apparatus comprising an illumination optical unit and a projection optical unit, the method comprising:

using the illumination optical unit to illuminate a reticle in an object field; and using the projection optical unit to project the reticle onto an image field, wherein:

the illumination optical unit comprises a mirror array comprising a plurality of optical components, for at least some of the plurality of optical components, the optical component comprises:

a micromirror with two degrees of freedom of pivoting; and at least one member selected from the group consisting of:

a sensor device; and a displacement device according to claim 1 configured to displace the micromirror.

12. The optical component of claim 1, wherein the electrode structure comprises at least two comb electrodes for each degree of freedom, and the at least two comb electrodes are actuated in a differential manner for each degree of freedom.

13. The optical component of claim 1, wherein the actuator electrodes comprise actuator transducer stator electrodes arranged in a region on a substrate which has a contour selected from the group consisting of a circular inner contour and a square or a circular outer contour.

14. An optical component, comprising:

a micromirror with two degrees of freedom of pivoting; and a sensor device comprising a sensor electrode structure, the sensor electrode structure comprising:

sensor transducer mirror electrodes; and sensor transducer stator electrodes, a voltage source configured to apply AC voltage to the transmitter electrode; and a shielding unit configured to variably shield the receiver electrode from the transmitter electrode, wherein:

the sensor device is configured to capture a pivot position of a mirror element having two degrees of freedom of pivoting; and the sensor device comprises a plurality of differential sensor pairs;

each differential sensor pair is defined by two sensor transducer stator electrodes that are opposite each other with respect to an effective pivot point of the micromirror; and each differential sensor pair defines a measurement axis along which the pivot position of the micromirror is captured.

15. The optical component of claim 14, wherein:

the sensor device comprises two differential sensor pairs;

each sensor pair defines a measurement axis along which the pivot position of the mirror element is captured; and the measurement axis are arranged orthogonal to each other.

16. The optical component of claim 14, wherein:

the sensor electrodes comprise sensor transducer stator electrodes disposed within an emergence circle surrounding a region within which there is no emergence of any of the sensor electrodes from sensor transducers stator electrodes in any possible tilt position of the micromirror.

17. The optical component of claim 16, wherein the emergence circle has a diameter which corresponds to the side length of a reflection surface of the micromirror.

18. The optical component of claim 14, further comprising a displacement device which comprises an electrode structure comprising actuator electrodes, wherein:

the actuator electrodes comprise comb electrodes;

all active actuator electrodes are arranged in a single plane; and the actuator electrodes define a direct drive configured to pivot a mirror element having two degrees of freedom of pivoting.

19. The optical component of claim 14, wherein the shielding unit comprises constituent parts of the sensor device which are mechanically connected to a mirror body of the mirror element.

* * * * *

UNITED STATES PATENT AND TRADEMARK OFFICE
CERTIFICATE OF CORRECTION

PATENT NO. : 10,761,317 B2
APPLICATION NO. : 15/692956
DATED : September 1, 2020
INVENTOR(S) : Markus Hauf and Yanko Sarov It is certified that error appears in the above-identified patent and that said Letters Patent is hereby corrected as shown below:

In the Specification

Column 5, Line 64, delete "1 mm-1 mm" and insert -- 1 mm · 1 mm --;

Column 5, Lines 65-67, delete "For mirrors with other dimensions and/or an alternative arrangement of the comb fingers, provision is made for scaling the spacings accordingly." and insert the same on Column 5, Line 64, as a continuation of the same paragraph;

Column 14, Lines 50-56, delete "The combs of the actuator transducer mirror electrodes 42 accordingly include actuator transducer mirror comb fingers 43, which are also abbreviated as mirror comb fingers or merely as comb fingers below. The number of the mirror comb fingers 43 corresponds to the number of the stator comb fingers. It may also deviate by one from the number of stator comb fingers in each case." and insert the same on Column 14, Line 49, as a continuation of the same paragraph;

Column 15, Line 17, delete "37i," and insert -- $37_i$, --;

Column 17, Line 18, delete "37i." and insert -- $37_i$. --;

Column 18, Line 40, delete "$37_1$" and insert -- $37_i$ --;

Column 18, Line 42, delete "$44_1$" and insert -- $44_i$ --;

Column 19, Line 31, delete "$44_k$," and insert -- $44_i$, --;

Column 19, Line 41, delete "$44_k$," and insert -- $44_i$, --;

Column 19, Line 45, delete "$44_k$," and insert -- $44_i$, --;

Column 21, Lines 32-33, delete "0.6 mm- 0.6 mm" and insert -- 0.6 mm · 0.6 mm --;

Signed and Sealed this
Tenth Day of November, 2020

Andrei Iancu
*Director of the United States Patent and Trademark Office*

CERTIFICATE OF CORRECTION (continued)
U.S. Pat. No. 10,761,317 B2

Column 24, Line 52, delete "$60_i$," and insert -- $60_1$, --;

Column 24, Line 56, delete "$61_i$ $61_2$;" and insert -- $61_1$, $61_2$; --;

Column 27, Line 11, delete "em-bodying" and insert -- embodying --;

In the Claims

Column 28, Line 8, Claim 6, after "some" insert -- of --;

Column 29, Line 23, Claim 12, delete "optical component" and insert -- displacement device --;

Column 29, Line 28, Claim 13, delete "optical component" and insert -- displacement device --.